United States Patent
Kawahara et al.

(10) Patent No.: US 8,466,708 B2
(45) Date of Patent: Jun. 18, 2013

(54) STATE DETECTION DEVICE FOR POWER SUPPLY SYSTEM

(75) Inventors: Youhei Kawahara, Hitachi (JP); Yoshinori Aoshima, Tsukubamirai (JP); Kenichiro Tsuru, Hitachinaka (JP); Akihiko Kudo, Hitachinaka (JP); Akihiko Emori, Hitachi (JP); Tatsumi Yamauchi, Hitachiota (JP)

(73) Assignees: Hitachi, Ltd., Tokyo (JP); Hitachi Vehicle Energy, Ltd, Hitachinaka-shi (JP)

( * ) Notice: Subject to any disclaimer, the term of this patent is extended or adjusted under 35 U.S.C. 154(b) by 329 days.

(21) Appl. No.: 12/750,279

(22) Filed: Mar. 30, 2010

(65) Prior Publication Data

US 2010/0244886 A1    Sep. 30, 2010

(30) Foreign Application Priority Data

Mar. 31, 2009  (JP) ................................. 2009-087007
Nov. 12, 2009  (JP) ................................. 2009-258894

(51) Int. Cl.
  *G01R 31/40*    (2006.01)
(52) U.S. Cl.
  USPC ..................................... 324/764.01; 320/132

(58) Field of Classification Search
  None
  See application file for complete search history.

(56) References Cited

U.S. PATENT DOCUMENTS 7,830,126 B2 *  11/2010  Kawahara et al. ............ 320/160

FOREIGN PATENT DOCUMENTS

| JP | 2003-303627 A | 10/2003 |
|---|---|---|
| JP | 2006-242880 A | 9/2006 |
| JP | 3975738 B2 | 6/2007 |

* cited by examiner

*Primary Examiner* — Minh N Tang
(74) *Attorney, Agent, or Firm* — Crowell & Moring LLP

(57) ABSTRACT

A state detection device for power supply system comprises: a measurement unit that obtains current, voltage, and temperature at a chargeable and dischargeable power storage unit as measurement values; a storage unit that stores property information of the power storage unit; an arithmetic unit that uses different methods to calculate first and second states of charge for the power storage unit based upon the measurement values and the property information; a conflict detection unit that detects a conflict in an event that a difference between the first state of charge and the second state of charge is equal to or greater than a predetermined threshold; and a correction unit that corrects the property information during charging or discharging of the power storage unit in response to the conflict having been detected by the conflict detection unit.

17 Claims, 18 Drawing Sheets

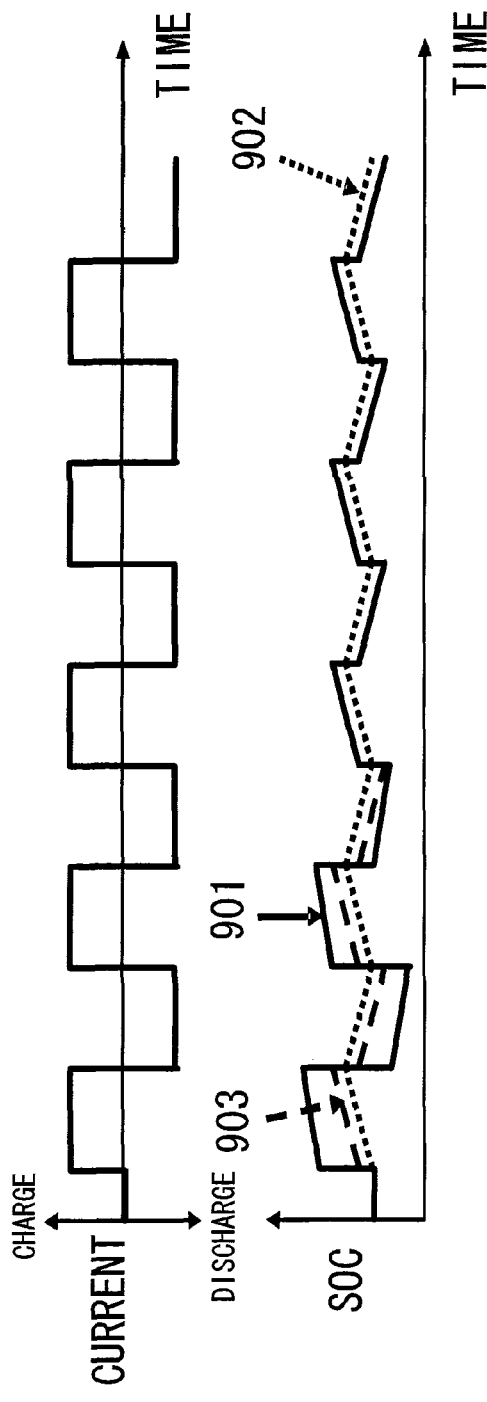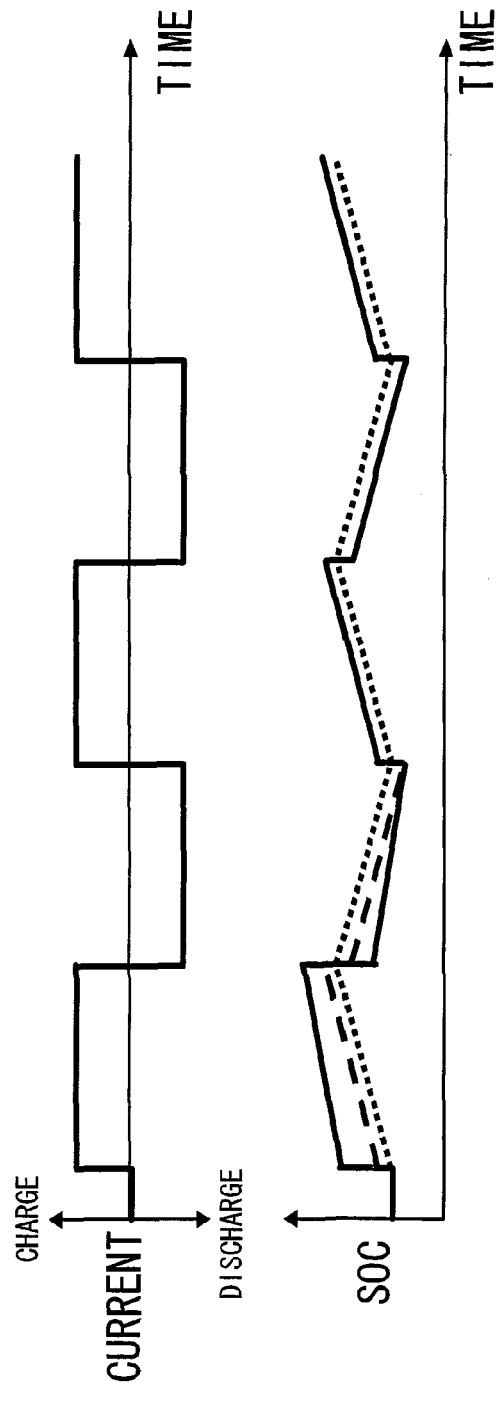
FIG. 9A CHARGE AND DISCHARGE SWITCH FREQUENTLY
FIG. 9B CHARGE AND DISCHARGE SWITCH LESS FREQUENTLY

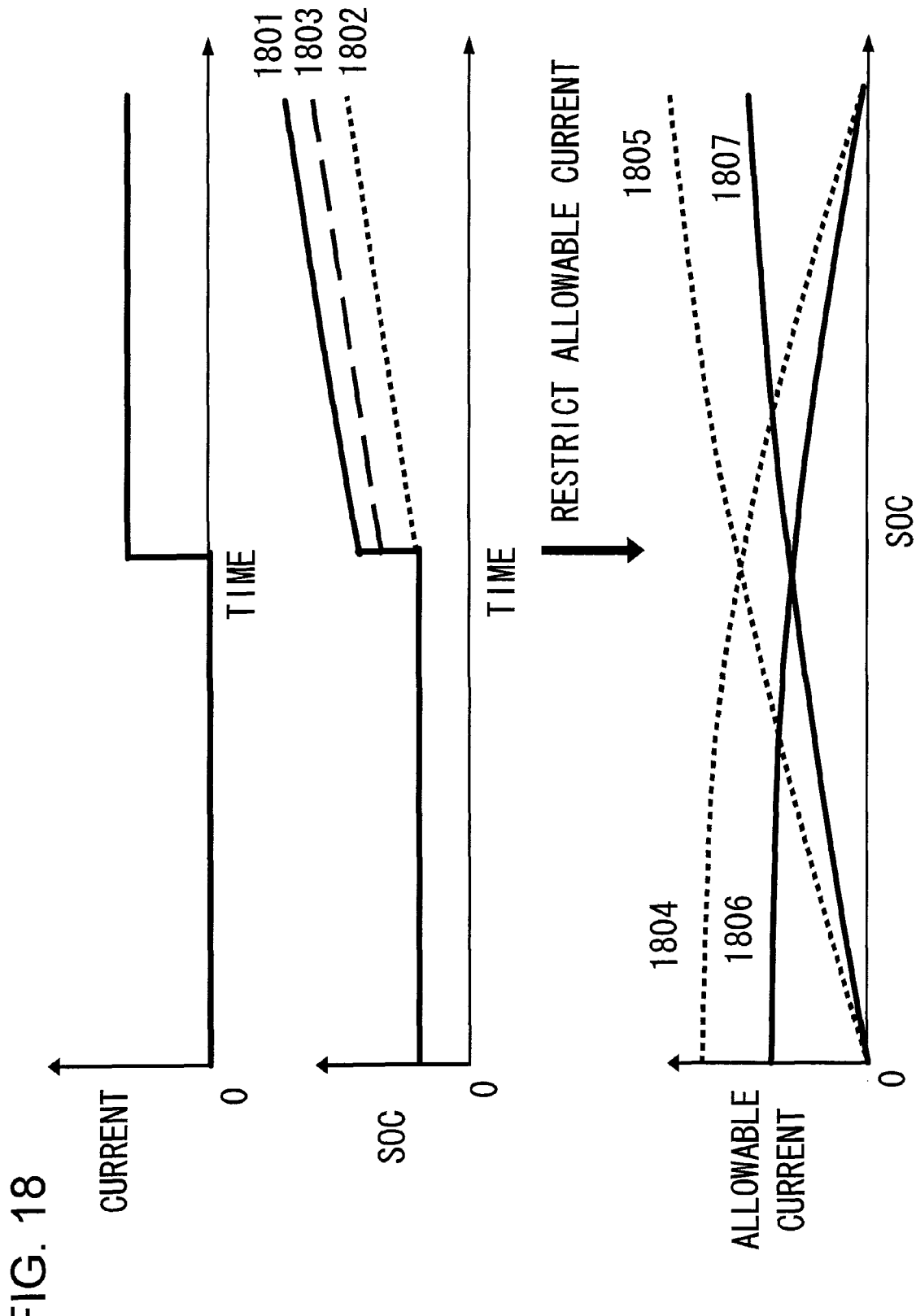

STATE DETECTION DEVICE FOR POWER SUPPLY SYSTEM

INCORPORATION BY REFERENCE

The disclosures of the following priority applications are herein incorporated by reference: Japanese Patent Application No. 2009-87007 filed Mar. 31, 2009, and Japanese Patent Application No. 2009-258894 filed Nov. 12, 2009.

BACKGROUND OF THE INVENTION

1. Field of the Invention

The present invention relates to a state detection device for power supply system that detects the state of a power storage means in a power supply system that uses the power storage means such as a lithium secondary battery, a nickel-metal hydride battery, a lead battery, an electrical double layer capacitor, or the like.

2. Description of Related Art

Power supply systems, distributed electric power storage devices and electric vehicles that use power storage means such as batteries are provided with a state detection device, which detects the state of the power storage means, for a safe, effective use of the power storage means. The states of the power storage means include the state of charge (SOC), which indicates how much the power storage means is charged or how much the dischargeable charge amount remains, the state of health (SOH), which indicates how much the power storage means is deteriorated, and so on.

In order to detect the state of the power storage means, the state detection device stores property information (internal DC resistance and the like) of the power storage means in advance, and executes processing to obtain the SOC, the SOH, or the like based upon the information. However, since the properties of the power storage means vary individually and change with deterioration, the property information needs to be optimized to fit the power storage means so as to perform battery state detection with a high degree of accuracy.

There is a known state detection device for power supply system that solves the problem by monitoring state detection results of the battery, detecting the state as a conflict deviating from the theoretical value in the event that the result exceeds a predetermined threshold, and correcting the property information in response to the detected conflict (patent reference literature 1).

[Patent Reference Literature 1] Japanese Laid Open Patent Publication No. 2006-242880

Detection of a conflict in a state detection result and correction to property information allow the property information to be optimized according to individual variability of the power storage means and the current deterioration development, thereby achieving high accuracy in battery state detection. The achievement of high-frequency correction to the property information enables the property information optimized for the power storage means to be obtained in a short time. In particular, in the event that there is a difference between the actual property information of the power storage means and that managed by the state detection device, it is preferable to correct the property information on the state detection device side with a high frequency so as to optimize the same as fast as possible. The present invention intends to provide a state detection device for power supply system that, if there is any conflict deviating from the theoretical value which arises in the result of the state detection of the power storage means, detects the conflict and corrects with a high frequency the property information necessary for state detection.

SUMMARY OF THE INVENTION

A state detection device for power supply system according to a 1st aspect of the present invention comprises: a measurement unit that obtains current, voltage, and temperature at a chargeable and dischargeable power storage unit as measurement values; a storage unit that stores property information of the power storage unit; an arithmetic unit that uses different methods to calculate a first state of charge and a second state of charge, each of which indicates a state of charge of the power storage unit, based upon the measurement values and the property information stored in the storage unit; a conflict detection unit that monitors a calculation result of a state of charge by the arithmetic unit during charging or discharging of the power storage unit, and detects the calculation result as a conflict in an event that a difference between the first state of charge and the second state of charge is equal to or greater than a predetermined threshold; and a correction unit that corrects the property information stored in the storage unit during charging or discharging of the power storage unit in response to the conflict having been detected by the conflict detection unit.

According to a 2nd aspect of the present invention, in the state detection device for power supply system according to the 1st aspect, it is preferred that the arithmetic unit calculates the first state of charge based upon open circuit voltage at the power storage unit, and calculates the second state of charge based upon integrated current at the power storage unit or based upon a weighted average of the first state of charge and integrated current.

According to a 3rd aspect of the present invention, in the state detection device for power supply system according to the 2nd aspect, the threshold may include a first threshold, a second threshold, a third threshold, and a fourth threshold. In this state detection device for power supply system, it is preferred that the conflict detection unit detects a first conflict as the conflict in an event that the first state of charge is greater than the second state of charge by equal to or greater than the first threshold during charging of the power storage unit or in an event that the first state of charge is smaller than the second state of charge by equal to or greater than the second threshold during discharging of the power storage unit, and detects a second conflict as the conflict in an event that the first state of charge is smaller than the second state of charge by equal to or greater than the third threshold during charging of the power storage unit or in an event that the first state of charge is greater than the second state of charge by equal to or greater than the fourth threshold during discharging of the power storage unit.

According to a 4th aspect of the present invention, in the state detection device for power supply system according to the 3rd aspect, it is desirable that the correction unit corrects the property information so as to raise it in an event that the conflict detection unit has detected the first conflict, and corrects the property information so as to reduce it in an event that the conflict detection unit has detected the second conflict.

According to a 5th aspect of the present invention, in the state detection device for power supply system according to any one of the 1st through 4th aspects, the threshold can be determined based upon at least any one of an offset error, a gain error, a thermal properties error, a quantization error, and a hysteresis error included in the measurement values.

According to a 6th aspect of the present invention, in the state detection device for power supply system according to any one of the 1st through 5th aspects, the correction unit may prohibit a correction on the property information after a predetermined time has elapsed since charge or discharge of the power storage unit was initiated.

According to a 7th aspect of the present invention, in the state detection device for power supply system according to any one of the 1st through 6th aspects, it is preferred that the property information is an internal DC resistance value of the power storage unit.

According to an 8th aspect of the present invention, the state detection device for power supply system according to the 7th aspect may further comprise a deterioration determination unit that makes a decision as to whether or not a life of the power storage unit has ended based upon a correction result of the internal DC resistance value by the correction unit.

According to a 9th aspect of the present invention, in the state detection device for power supply system according to the 8th aspect, it is preferred that the deterioration determination unit calculates a rate of rise of the internal DC resistance value based upon a correction result of the internal DC resistance value and an initial value of the internal DC resistance value, and makes a decision as to whether or not a life of the power storage unit has ended based upon the calculation result.

According to a 10th aspect of the present invention, in the state detection device for power supply system according to the 9th aspect, it is preferred that the deterioration determination unit makes a decision that a life of the power storage unit has ended in an event that the rate of rise becomes equal to or greater than a predetermined value.

According to an 11th aspect of the present invention, in the state detection device for power supply system according to the 9th aspect, it is also preferred that the deterioration determination unit calculates current or electric power that the power storage unit can input or output based upon the rate of rise and, in an event that the current or electric power falls below a predetermined required performance value, makes a decision that a life of the power storage unit has ended.

According to a 12th aspect of the present invention, in the state detection device for power supply system according to any one of the 1st through 11th aspect, the measurement unit may further obtain an ambient temperature as the measurement value. In this state detection device for power supply system, it is preferred that the conflict detection unit prohibits a detection of the conflict in an event that the ambient temperature falls outside a predetermined range.

According to a 13th aspect of the present invention, in the state detection device for power supply system according to any one of the 1st through 12th aspect, the arithmetic unit may perform a state detection of the power storage unit and calculate a current value or an electric power value that the power storage unit can input or output. It is preferred that this state detection device for power supply system further comprises: an output unit that outputs the current value or the electric power value that has been calculated by the arithmetic unit; and a charge and discharge restriction unit that restricts the current value or the electric power value output by the output unit in an event that a result of the state detection by the arithmetic unit meets a predetermined condition during charging or discharging of the power storage unit.

A state detection device for power supply system according to a 14th aspect of the present invention comprises: a measurement unit that obtains current, voltage, and temperature at a chargeable and dischargeable power storage unit as measurement values; a storage unit that stores property information of the power storage unit; an arithmetic unit that uses different methods to calculate a first state of charge and a second state of charge, each of which indicates a state of charge of the power storage unit, and calculates a current value or an electric power value that the power storage unit can input or output, based upon the measurement values and the property information stored in the storage unit; an output unit that outputs the current value or the electric power value that has been calculated by the arithmetic unit; and a charge and discharge restriction unit that restricts the current value or the electric power value output by the output unit in an event that a difference between the first state of charge and the second state of charge is equal to or greater than a predetermined threshold during charging or discharging of the power storage unit.

According to the present invention, in the event that a conflict deviating from the theoretical value arises after a predetermined operation was performed by the state detection device for power supply system, the property information for the predetermined operation can be corrected with a high frequency.

BRIEF DESCRIPTION OF THE DRAWINGS

FIGS. 9A and 9B are graphs showing the processing contents of the conflict detection means and the correction means related to the first embodiment of the present invention.

FIG. 18 illustrates the allowable charge and discharge current restriction of the charge and discharge restriction means related to the fourth embodiment of the present invention.

DESCRIPTION OF PREFERRED EMBODIMENTS

-The First Embodiment-

Figure 1:
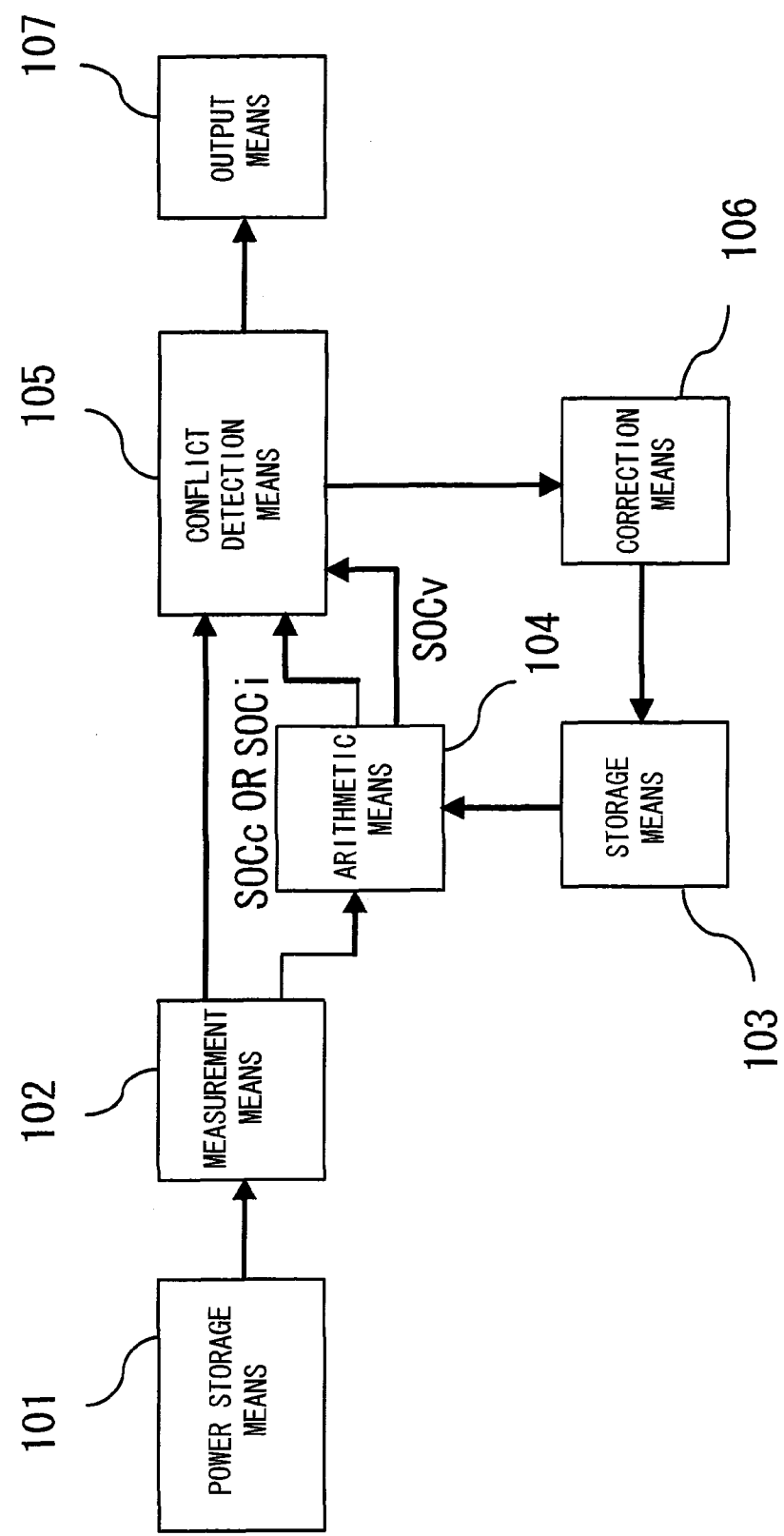
FIG. 1 is a block diagram of the state detection device for power supply system according to the first embodiment of the present invention.

FIG. 1 is a block diagram of the state detection device for power supply system according to the first embodiment of the present invention. The state detection device according to the present embodiment detects the state of a power storage means 101, which stores the electricity to discharge. The state detection device is constituted with a measurement means 102 that measures the power storage means 101 to obtain measurement values, a storage means 103 used to store property information that exhibits the properties of the power storage means 101, an arithmetic means 104 that reads out the property information from the storage means 103 to carry out an operation, a conflict detection means 105 that monitors the arithmetic operation result obtained by the arithmetic means 104 to detect a conflict, a correction means 106 that corrects the property information stored in the storage means 103 according to the conflict detection result by the conflict detection means 105, and an output means 107 to output externally the result obtained by the arithmetic means 104.

The power storage means 101 is constituted with a power storage device such as a lithium-ion battery, a nickel-metal hydride battery, a lead battery, electrical double layer capacitor, or the like. The power storage means 101 may assume either a single cell or a module structure in which a plurality of single cells are combined.

The measurement means 102 is constituted with a variety of sensors and an electrical circuit so as to obtain the measurement values used to detect the state of the power storage means 101. The measurement values obtained by the measurement means 102 include at least the voltage, the current, and the temperature of the power storage means 101. After obtaining the measurement values through the variety of sensors provided outside of the power storage means 101, the measurement means 102 uses the electrical circuit to output the measurement values to the arithmetic means 104.

The storage means 103 is constituted with a memory device such as a flash memory, an electrically erasable programmable read only memory (EEPROM), a magnetic disk, or the like. The storage means 103 may be provided outside of the arithmetic means 104 as in FIG. 1 or implemented as a memory device provided inside the arithmetic means 104. The storage means 103 stores one or more types of each of the property information of the power storage means 101 and the arithmetic procedure for detecting the state of the power storage means 101. It is to be noted that the state detection device according to the present embodiment may include a plurality of the storage means 103.

The storage means 103 may be detachable from the state detection device. A detachable storage means 103 is replaced so as to update the property information and the arithmetic procedure with ease. In addition, the state detection device may be provided with a plurality of detachable storage means 103 so as to store the property information and the arithmetic procedure in separate storage means 103. The property information and the arithmetic procedure can thus be updated in a variety of combinations.

The storage means 103 stores the internal DC resistance value of the power storage means 101 as property information. In addition, the storage means 103 may store the polarization resistance, the charging efficiency, the allowable current, the full capacity, and the like of the power storage means 101 as property information. The contents of the property information are predetermined according to the properties of the power storage means 101. It is to be noted that for the property information, individual values may be set on charge and on discharge, and moreover, different values may be set according to the state of the power storage means 101, for instance, the state of charge, the temperature, and the like. Alternatively, a common value may be set as property information regardless of the state of the power storage means 101.

The storage means 103 stores an arithmetic procedure to obtain the state of charge of the power storage means 101 so as to detect the state of the power storage means 101. In addition, the storage means 103 may store the processing of the power storage means 101 such as the control of allowable current, continuous charge and discharge time, and temperature, detection of over-charge and over-discharge, and the like. These arithmetic procedures are executed by the arithmetic means 104.

The arithmetic means 104 is constituted with a microprocessor, a computer, or the like. Based on the measurement values obtained by the measurement means 102 and the property information stored in the storage means 103, the arithmetic means 104 carries out an operation based on the arithmetic procedure stored in the storage means 103 so as to detect the state of the power storage means 101.

The conflict detection means 105 monitors the result of the state detection by the arithmetic means 104, as to whether or not a conflict deviating from the theoretical value has arisen. In the event that the result obtained by the arithmetic means 104 deviates from the theoretical value, the conflict detection means 105 detects the result as a conflict.

The correction means 106 corrects the property information stored in the storage means 103 corresponding to the conflict deviating from the theoretical value detected by the conflict detection means 105. The correction means 106 may be activated only in the event that the conflict detection means 105 has detected a conflict deviating from the theoretical value, or may be activated regardless of whether or not a conflict deviating from the theoretical value has arisen. In the event that the correction means 106 is activated regardless of whether or not a conflict has arisen, the correction means 106 may correct the property information with a predetermined amount of correction if the conflict detection means 105 has detected the conflict, and may correct it with zero amount of correction if there is not any conflict deviating from the theoretical value.

The output means 107 is constituted with a device or circuit to output a signal externally according to a communication method such as Ethernet, controller area network (CAN), wireless local area network (wireless LAN), near field communication, or the like. It is to be noted that the output means 107 may output the signal via either wired or wireless communication. Alternatively, a display device such as a monitor may be used as the output means 107. In this case, the output means 107 outputs, for example, the measurement values of the measurement means 102, the result of the state detection of the power storage means 101 by the arithmetic means 104, the property information stored in the storage means 103, and the like. In addition, the chronological change may be displayed in graph or the like.

Figure 2:
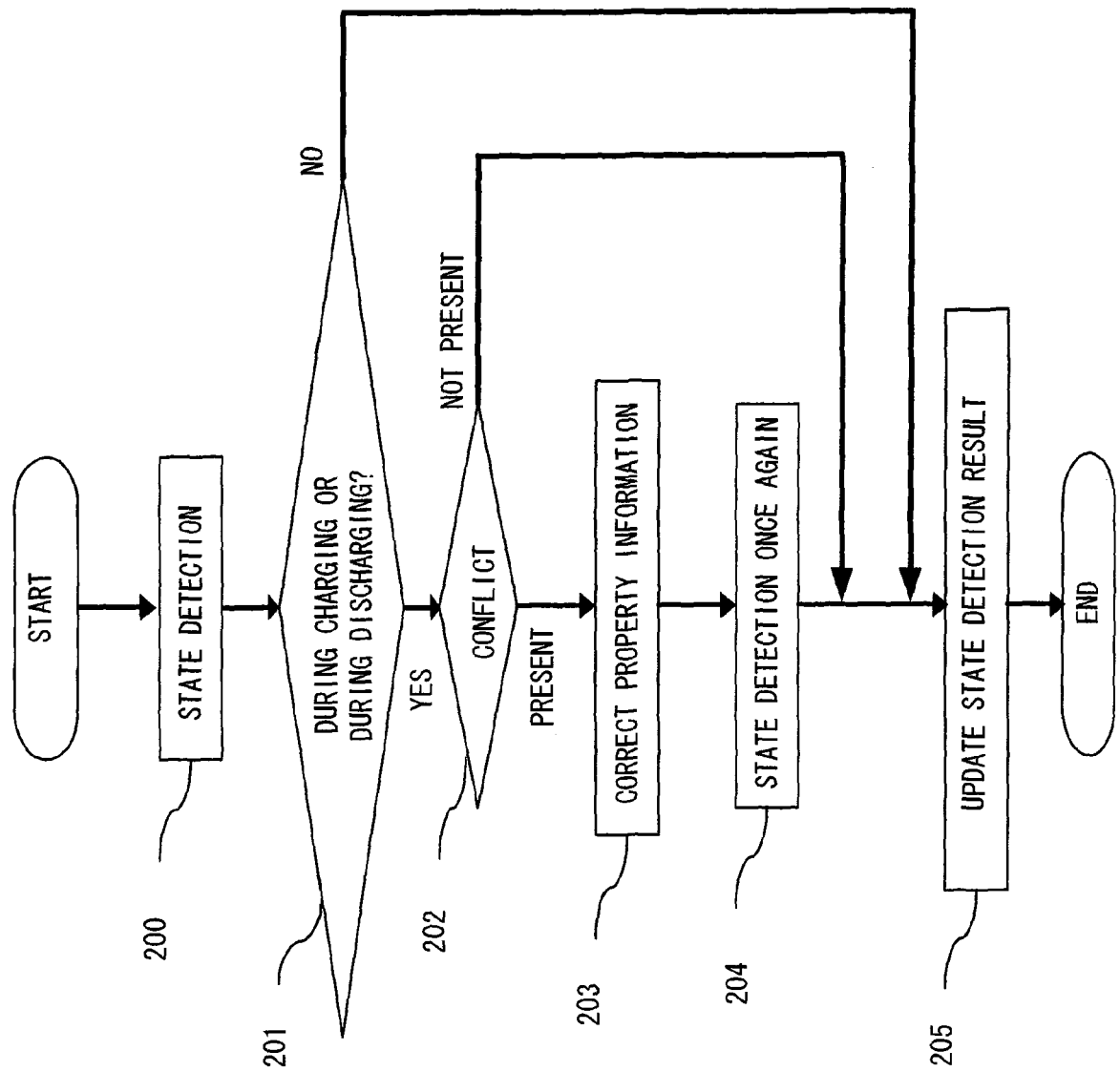
FIG. 2 is a diagram presenting the operational flow of the state detection device for power supply system according to the first embodiment of the present invention.

FIG. 2 presents the operational flow of the state detection device described above. The arithmetic means 104, the conflict detection means 105, and the correction means 106 each perform processing according to the operational flow. In a step 200, based upon the measurement values obtained by the measurement means 102 and the property information stored in the storage means 103, the arithmetic means 104 detects the state of the power storage means 101. The specific method of the state detection will be described later.

In a step 201, the arithmetic means 104 makes a decision as to whether or not the power storage means 101 is on charging or on discharging. In the event that the power storage means 101 is on charging or on discharging, the flow of control proceeds to a step 202. In the event that the power storage means 101 is not on charging nor on discharging, the flow of control proceeds to a step 205.

In the step 202, based upon the measurement values obtained by the measurement means 102 and the result of the state detection by the arithmetic means 104, the conflict detection means 105 makes a decision as to whether or not there is a conflict deviating from the theoretical value. In the event that the conflict detection means 105 makes a decision that there is a conflict, the flow of control proceeds to a step 203, while in the event that the conflict detection means 105 makes a decision that there is not any conflict, the flow of control proceeds to the step 205.

In the step 203, the correction means 106 corrects the property information stored in the storage means 103. The corrected property information is stored in the storage means 103 in place of the previous property information, thereby updating the contents of the property information.

In a step 204, based upon the measurement values obtained by the measurement means 102 and the corrected property information stored in the storage means 103, the arithmetic means 104 detects the state of the power storage means 101 once again as in the step 200.

In the step 205, the arithmetic means 104 updates the obtained result of the state detection as the latest information and transmits it to the output means 107. When the result of the state detection is transmitted from the arithmetic means 104, the output means 107 outputs the result externally in the same manner as described above. After executing the step 205, the flow of control of FIG. 2 terminates. The flow of control of the operational flow of FIG. 2 described above is to be executed at time intervals that are predetermined by the state detection device so that the output means 107 continues to transmit the latest result of the state detection.

It is to be noted that the conflict detection means 105 and the correction means 106 may be implemented as separate microprocessors or computers each perform the processing described above, or may be implemented as a single microprocessor or a single computer that collectively performs the processing described above. In this case, the arithmetic means 104, the conflict detection means 105, and the correction means 106 are connected via a communication means that exchanges information and commands.

While in FIG. 1 the conflict detection means 105 and the correction means 106 are provided outside of the arithmetic means 104, each of them may be implemented as a program module or a subroutine of the processing content described above executed by the arithmetic means 104. Alternatively, the processing executed by the conflict detection means 105 and the correction means 106 described above may be implemented as a collective operation procedure. In this case, the conflict detection means 105 and the correction means 106 are stored in the storage means 103 and read out by the arithmetic means 104.

Figure 3:
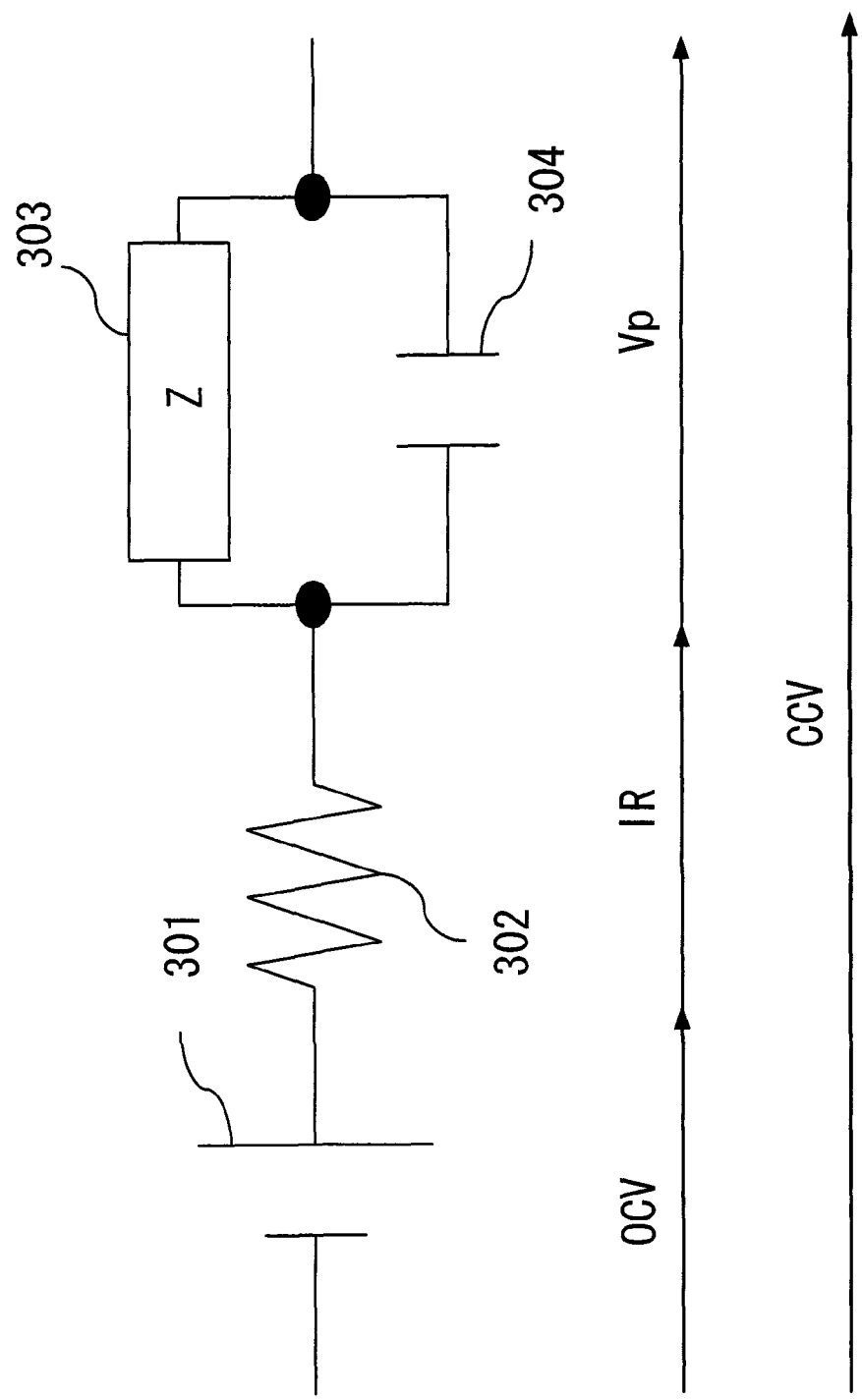
FIG. 3 is a circuit diagram presenting an equivalent circuit of the power storage means related to the first embodiment of the present invention.

Next, the arithmetic procedure will now be explained in detail that detects the state of the power storage means 101 in the steps 200 and 204 of FIG. 2. FIG. 3 is a circuit diagram presenting an equivalent circuit of the power storage means 101. In FIG. 3, the numeral 301 represents an electromotive force of the power storage means 101, i.e., the open circuit voltage (OCV), the numeral 302 represents the internal DC resistance (R), the numeral 303 represents the impedance (Z), and the numeral 304 represents the capacitance component (C). As shown in FIG. 3, the power storage means 101 is expressed by a parallely connected pair of the impedance 303 and the capacitance component 304 and a serial connection of the internal DC resistance 302 and the electromotive force 301. A closed circuit voltage (CCV) at the power storage means 101 when the current I is applied to the power storage means 101 is expressed by the following equation 1.

$$CCV = OCV + I \cdot R + Vp \quad \text{(Equation 1)}$$

where Vp represents the polarization voltage, corresponding to the voltage at the parallely connected pair of Z and C.

Although the OCV is used to calculate the SOC (state of charge), it is impossible to directly measure the OCV in a state in which the power storage means 101 is on charging or on discharging. The OCV is thus calculated by deducting IR drop and Vp from the CCV as the following equation 2.

$$OCV = CCV - IR - Vp \quad \text{(Equation 2)}$$

Figure 4:
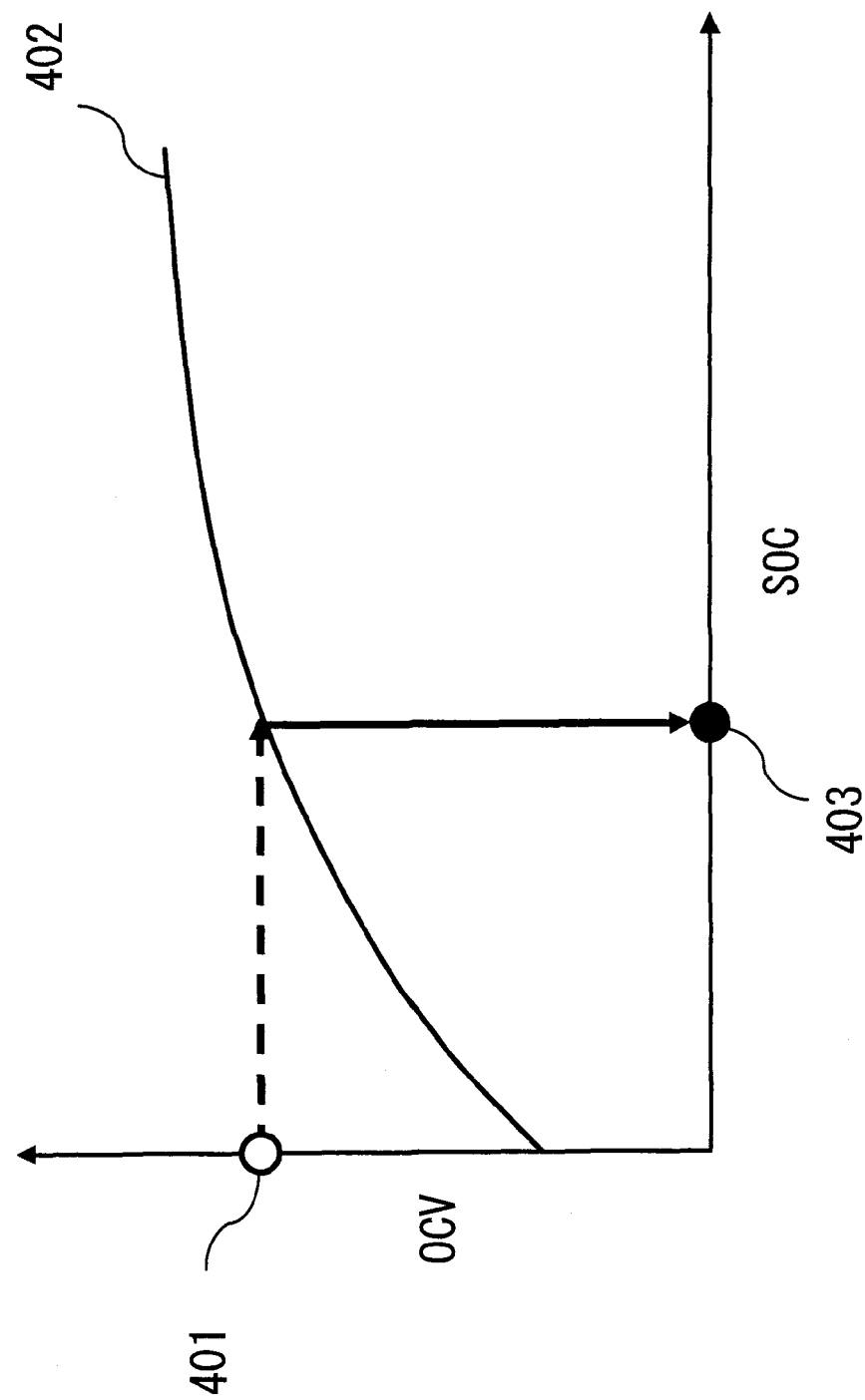
FIG. 4 is a graph showing the property information of the open circuit voltage (OCV) and the state of charge (SOC) of the power storage means related to the first embodiment of the present invention.

In equation 2, R and Vp can be obtained through the property information stored in the storage means 103. The values of R and Vp are determined according to the state of charge, the temperature, or the like of the power storage means 101. On the other hand, the current value I can be obtained through the measurement values obtained by the measurement means 102. Through a calculation of the OCV using equation 2 with I, R, and Vp, the SOC (SOCv) of the power storage means 101 can be estimated based upon a preset relationship between the OCV and the SOC. In other words, based upon the electromotive force (open circuit voltage) OCV of the power storage means 101, the SOCv, which represents the state of charge of the power storage means 101, is obtained. For instance, as shown in FIG. 4, in the event that the OCV assumes the value shown by the numeral 401 and the relationship between the OCV and the SOC is expressed by the curve shown by the numeral 402, the value of the SOC is estimated as shown by the numeral 403.

In addition to the arithmetic procedure described above, the arithmetic means 104 calculates the SOC expressed by equations 3 and 4. Here, I is a current value to and from the power storage means 101 measured by the measurement means 102, and Qmax is the capacity of the power storage means 101 when fully charged. W in equation 4 is a factor to weight on both SOC values (SOCv and SOCi). SOC errors that can occur in each of the SOC are calculated in advance, and then the weighting factor W that has been optimized so that the SOC errors are minimized is stored in the storage means 103 in advance. It is to be noted that the weighting factor W may be determined by the arithmetic means 104 so that the errors that can occur in each of the SOC in real time and the errors are minimized. Alternatively, the weighting factor W may be determined based upon one or more pieces of information such as the temperature or the SOC of the power storage means 101, the property information of the power storage means 101, the state of use of the power storage means 101 represented by the current value to and from the power storage means 101, an abnormal state of the measurement means 102, or the like. Thus, the SOCv and the SOCi are combined so as to minimize the errors, thereby calculating another SOC (SOCc), which is more accurate than the SOCv.

$$SOCi = SOC + 100 \times \int Idt/Qmax \quad \text{(Equation 3)}$$

$$SOCc = W \times SOCv + (1-W) \times SOCi \quad \text{(Equation 4)}$$

In equation 3, the SOCi is calculated based upon $\int Idt$, which represents an integrated current at the power storage means 101. In equation 4, the SOCc is calculated based upon the SOCi and the SOCv. In other words, the SOCi and the SOCc, which represent the states of charge of the power storage means 101, are each the result of a calculation of the state of charge in a different method from that used for the calculation of the SOCv described above, or are each the result of a calculation of the state of charge of the power storage means 101 in a combination of the characteristics of the different method.

It is to be noted that in the present embodiment, the arithmetic means 104 calculates the SOCc using equation 4 based upon the SOCi obtained through equation 3. However, in the event that the current value obtained through the measurement means 102 is highly accurate, or in the event that processing is performed in a limited condition that the error included in the current value is negligible, equation 4 may not be applied. In this case, simply equation 2, the calculation of the SOCv explained in FIG. 4, and the calculation of the SOCi using equation 3 are sufficient. In other words, the arithmetic means 104 obtains two types of SOC, which are the SOCv and the SOCi or the SOCc, as the state of charge of the power storage means 101.

Although in the present embodiment the SOCi or the SOCc is used, the SOC may be calculated in any manner as long as the SOC is calculated in a different manner from that the SOCv is calculated and the error is reduced more than the manner the SOCv is calculated.

Using the arithmetic procedure explained above to obtain two different types of SOC, the arithmetic means 104 detects the state of the power storage means 101 in the steps 200 and 204 of FIG. 2. The result of the state detection thus performed is transmitted from the arithmetic means 104 to the conflict detection means 105.

The conflict detection means 105 monitors the two types of SOC obtained through the arithmetic procedure as above in the arithmetic means 104 as the result of the state detection of the power storage means 101. Then, in the step 202 of FIG. 2, the conflict detection means 105 makes a decision as to whether or not any conflict has arisen in the result. The operation of the conflict detection performed by the conflict detection means 105 will now be explained.

Among the measurement values of the power storage means 101 obtained by the measurement means 102, the conflict detection means 105 obtains the current value. It is natural for the SOC to increase by the amount of charge when the current value indicates the charge. However, in the event that the internal DC resistance (R) of the property information of the power storage means 101 used to calculate the SOCv is smaller than the true property of the power storage means 101, the SOCv increases more abruptly than the true value does, and then gives a higher calculation result than the true value is. Upon discharge, on the other hand, the SOCv decreases more abruptly than the true value does, and then gives a lower calculation result than the true value is. The conflict detection means 105 detects it as a conflict deviating from the theoretical value.

Figure 5:
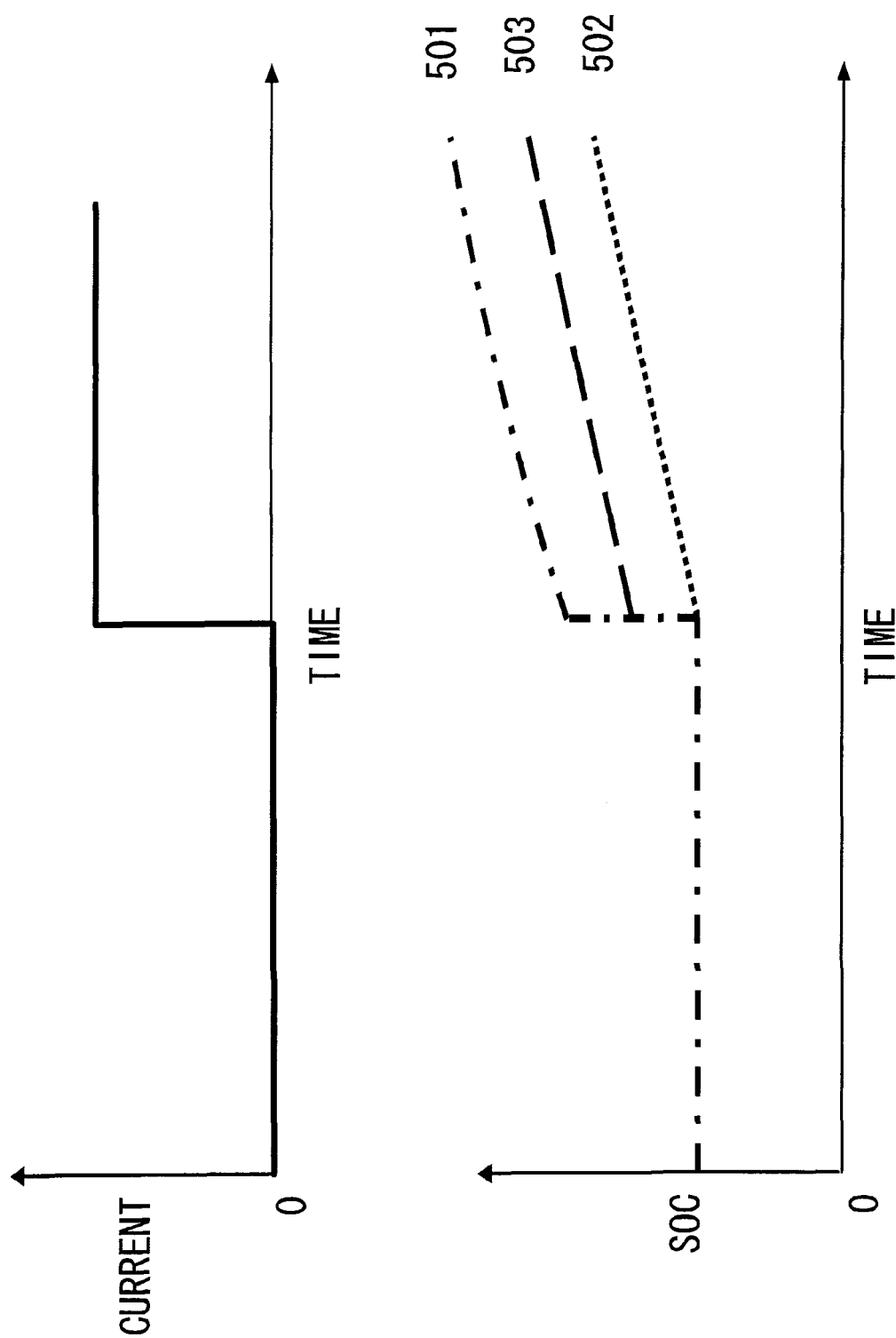
FIG. 5 is a graph showing a case in which the result of the state detection related to the first embodiment of the present invention deviates from the theoretical value.

The processing content of the conflict detection means 105 will now be explained in detail in reference to FIG. 5 with an example of charge time. In FIG. 5, the numeral 501 represents the SOCv during pulse charging and the numeral 502 represents the SOCc. As described above, in the event that the value of the internal DC resistance R stored in the storage means 103 as property information is smaller than the true internal DC resistance value of the power storage means 101, the SOCv increases abruptly when the charge of the power storage means 101 is initiated, and during charging the SOCv is calculated as a value greater than the true value. On the other hand, being combined with the SOCi, which is obtained based upon the current integration, the SOCc is close to the true value and therefore it does not cause a significant error as the SOCv, which is denoted by the numeral 501, does. With this, the conflict detection means 105 uses the reference value denoted by the numeral 503 so as to detect the SOCv error that occurs in the case where R of the property information stored in the storage means 103 is too small. More specifically, a predetermined detection threshold Th is added to the SOCc of the numeral 502 to be designated as the reference value SOCc_+th, and during charging, the SOCv and the reference value SOCc_+th are compared. In the event that the both are the same or the SOCv is greater, the conflict detection means 105 detects the SOCv error as a conflict deviating from the theoretical value. In other words, in the event that the SOCv is greater than the SOCc by equal to or greater than the threshold Th, a decision is made that a conflict deviating from the theoretical value has arisen.

It is preferable to determine the threshold Th based upon the errors included in the measurement values of the measurement means 102. This is because it is preferable that the conflict detection means 105 permits the SOCv error and does not detect it as a conflict on the grounds that, as long as the SOCv error falls within the range of the error included in the measurement values of the measurement means 102, R, which is stored in the storage means 103, is probably too small, or the errors are included in the measurement values obtained by the measurement means 102. The errors included in the measurement values of the measurement means 102 include an offset error, a gain error, a quantization error, a hysteresis error, an error due to the thermal properties, and the like. Based upon one or more of those errors, the SOC error that occurs in the SOCv can be estimated and set as the threshold Th. It is to be noted that a plurality of values may be set as the threshold Th according to the current, or a plurality of values may be set as the threshold Th according to the temperature, the state of charge, the state of deterioration, or the like of the power storage means 101.

On the other hand, upon discharge, in the event that the value of R stored in the storage means 103 as property information is smaller than the true internal DC resistance value of the power storage means 101, the SOCv decreases more abruptly than the true value does when the discharge of the power storage means 101 is initiated, and then the calculation result of the SOCv becomes lower than the true value. Being combined with the SOCi, which is obtained based upon the current integration, the SOCc is close to the true value and therefore it does not cause a significant error as the SOCv does. With this, the conflict detection means 105 detects the SOCv error that occurs in the case where R of the property information stored in the storage means 103 is too small. More specifically, the detection threshold Th described above is subtracted from the SOCc to be designated as the reference value SOCc_−th, and during discharging, the SOCv and the reference value SOCc_−th are compared. In the event that the both are the same or the SOCv is smaller, the conflict detection means 105 detects the SOCv error as a conflict deviating from the theoretical value. In other words, in the event that the SOCv is smaller than the SOCc by equal to or greater than the threshold Th, a decision is made that a conflict deviating from the theoretical value has arisen.

Figure 6:
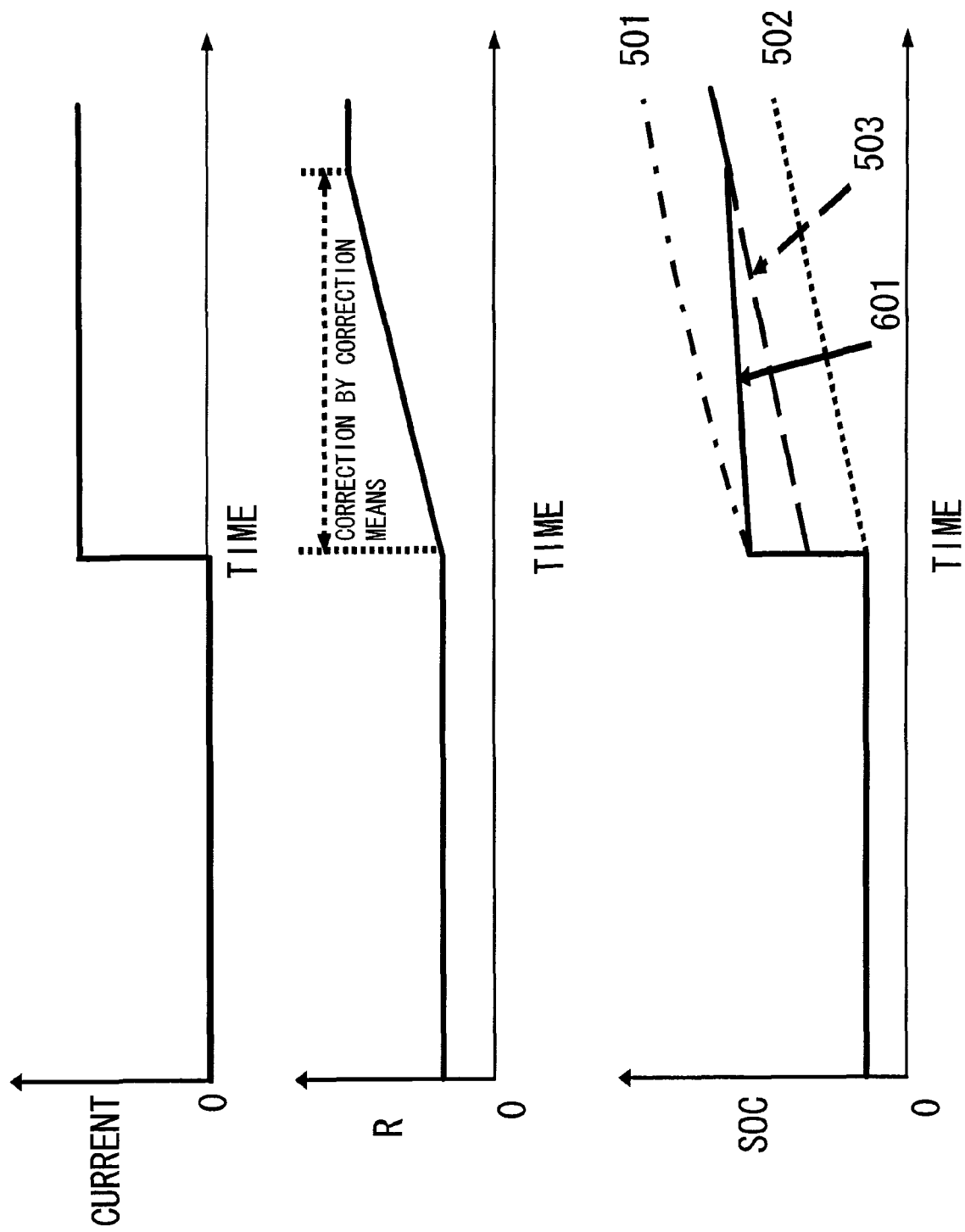
FIG. 6 is a graph showing the processing contents of the conflict detection means and the correction means related to the first embodiment of the present invention.

In the event that the conflict detection means 105 detects the conflict deviating from the theoretical value described above, the correction means 106 corrects the property information stored in the storage means 103, and then the corrected property information is newly stored in the storage means 103. The operation of the correction means 106 in this case will now be explained in reference to FIG. 6. It is to be noted that in FIG. 6 the numeral 501 represents the SOCv during pulse charging, the numeral 502 represents the SOCc, and the numeral 503 represents the reference value used to detect the SOCv error, and their functions are the same as those in FIG. 5. FIG. 6 includes the graphs indicating the change in the internal DC resistance R and the change in the SOCv (the numeral 601 of FIG. 6) with the change in the internal DC resistance R.

In the event that the conflict deviating from the theoretical value is detected as described above, i.e., in the event that during charging of the power storage means 101 the SOCv is greater than the SOCc by equal to or greater than the threshold Th, or in the event that during discharging of the power storage means 101 the SOCv is smaller than the SOCc by equal to or greater than the threshold Th, the conflict can be resolved by raising the value of the internal DC resistance R in the property information. Therefore, the correction means 106 applies the correction so as to raise the internal DC resistance R as shown in FIG. 6. The corrected internal DC resistance R is stored in the storage means 103 as new property information, and used to calculate the SOCv in the next operation.

The timing in which the correction means 106 corrects the internal DC resistance R in the property information may be applied to all the while the conflict detection means 105 is detecting the SOCv error. Since in this case the correction is repeated per unit time of calculation of the SOCv until the SOCv error is resolved (the numeral 601 in FIG. 6 indicates the SOCv error resolved by correction of R), the internal DC resistance R can be optimized in a relatively short amount of time so as to fit the true property information of the power storage means 101. In the event that the SOCv error is expected to occur because of a factor other than the errors included in the measurement values of the measurement means 102, after a predetermined time has elapsed since charge or discharge of the power storage means 101 was initiated, time restriction may be placed by prohibiting the correction on the property information. For instance, the property information may be corrected for limited length of time such as one second, five seconds, ten seconds, and twenty seconds.

The amount of correction of the internal DC resistance R for one correction may be a percentage such as 1% or a fixed value such as 1 mΩ, 0.1 mΩ, and 0.01 mΩ. Alternatively, the amount of correction of the internal DC resistance R may be varied according to the SOCv error. In the event that the values of the internal DC resistance R are stored in a table according to the temperature, the state of charge, or the like in the storage means 103, only one of the values from the table may be corrected or the whole table may be corrected at a time. In addition, the whole table may be corrected with respect to one of the states of battery such as a table according to the temperature, a table according to the state of charge, or the like.

Next, on the contrary to the case described above, the operation of the conflict detection means 105 will be explained in the event that the current value obtained by the measurement means 102 indicates the charge and the result of the state detection executed by the arithmetic means 104 indicates a decrease in the SOC, or in the event that the current value indicates the discharge and the result of the state detection executed by the arithmetic means 104 indicates an increase in the SOC.

It is natural for the SOC to increase by the amount of charge when the current value obtained by the measurement means 102 indicates the charge. However, in the event that the value of the internal DC resistance R stored in the storage means 103 as property information of the power storage means 101 is greater than the true internal DC resistance value of the power storage means 101, the SOCv changes abruptly in the opposite direction of the true value, and then the SOC calculation result will be lower than the true value during charging and higher than the true value during discharging. The conflict detection means 105 detects the SOC calculation result as a conflict deviating from the theoretical value.

Figure 7:
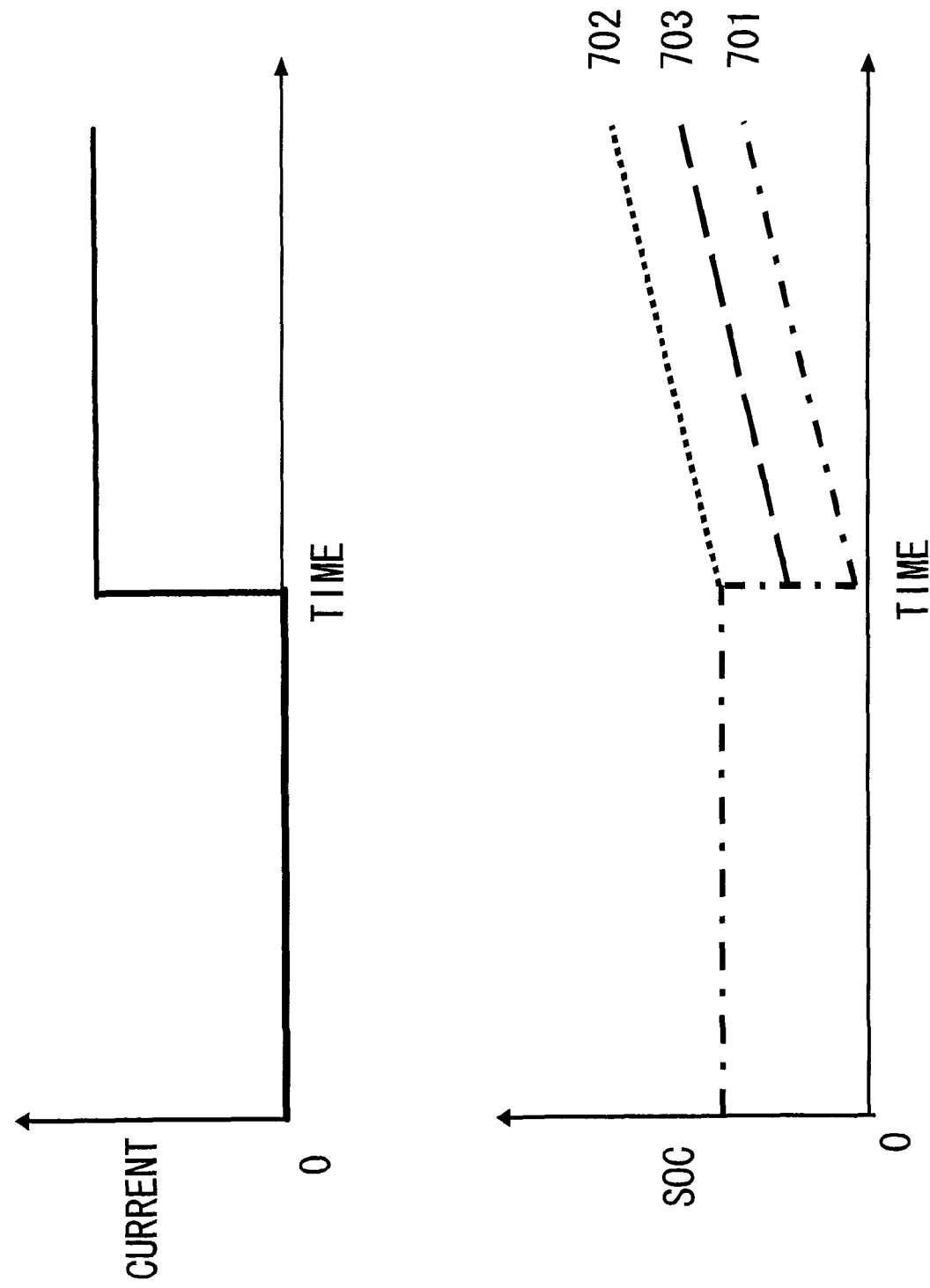
FIG. 7 is a graph showing a case in which the result of the state detection related to the first embodiment of the present invention deviates from the theoretical value.

The processing content of the conflict detection means 105 will now be explained in detail in reference to FIG. 7 with an example of charge time. In FIG. 7, the numeral 701 represents the SOCv during pulse charging and the numeral 702 represents the SOCc. As described above, in the event that the value of the internal DC resistance R stored in the storage means 103 as property information is greater than the true internal DC resistance value of the power storage means 101, the SOCv changes abruptly in the opposite direction of the true value when the charge of the power storage means 101 is initiated, and during charging the SOCv continues to be calculated as a value smaller than the true value. On the other hand, being combined with the SOCi, which is obtained based upon the current integration, the SOCc is close to the true value and therefore it does not cause a significant error as the SOCv, which is denoted by the numeral 701, does. With this, the conflict detection means 105 uses the reference value denoted by the numeral 703 so as to detect the SOCv error that occurs in the case where R of the property information stored in the storage means 103 is too great. More specifically, a predetermined detection threshold Th is subtracted from the SOCc of the numeral 702 to be designated as the reference value SOCc_−th, and during charging, the SOCv and the reference value SOCc_−th are compared. In the event that the both are the same or the SOCv is smaller, the conflict detection means 105 detects the SOCv error as a conflict deviating from the theoretical value. In other words, in the event that the SOCv is smaller than the SOCc by equal to or greater than the threshold Th, a decision is made that a conflict deviating from the theoretical value has arisen. As described above, the detection threshold Th can be determined based upon the error included in the measurement values of the measurement means 102.

On the other hand, upon discharge, in the event that the value of R stored in the storage means 103 as property information is greater than the true internal DC resistance value of the power storage means 101, the SOCv changes abruptly in the opposite direction of the true value when the discharge of the power storage means 101 is initiated, and during discharging the SOCv is calculated as a value greater than the true value. On the other hand, being combined with the SOCi, which is obtained based upon the current integration, the SOCc is close to the true value and therefore it does not cause a significant error as the SOCv does. With this, the conflict detection means 105 detects the SOCv error that occurs in the case where R of the property information stored in the storage means 103 is too great. More specifically, the detection threshold Th described above is added to the SOCc to be designated as the reference value SOCc_+th, and during discharging, the SOCv and the reference value SOCc_+th are compared. In the event that the both are the same or the SOCv is greater, the conflict detection means 105 detects the SOCv error as a conflict deviating from the theoretical value. In other words, in the event that the SOCv is greater than the SOCc by equal to or greater than the threshold Th, a decision is made that a conflict deviating from the theoretical value has arisen.

In the event that the conflict deviating from the theoretical value is detected as described above, i.e., in the event that during charging of the power storage means 101 the SOCv is smaller than the SOCc by equal to or greater than the threshold Th, or in the event that during discharging of the power storage means 101 the SOCv is greater than the SOCc by equal to or greater than the threshold Th, the conflict can be resolved by reducing the value of the internal DC resistance R in the property information. Therefore, the correction means 106 applies the correction so as to reduce the internal DC resistance R. The corrected internal DC resistance R is stored in the storage means 103 as new property information, and used in the next operation.

Figure 8:
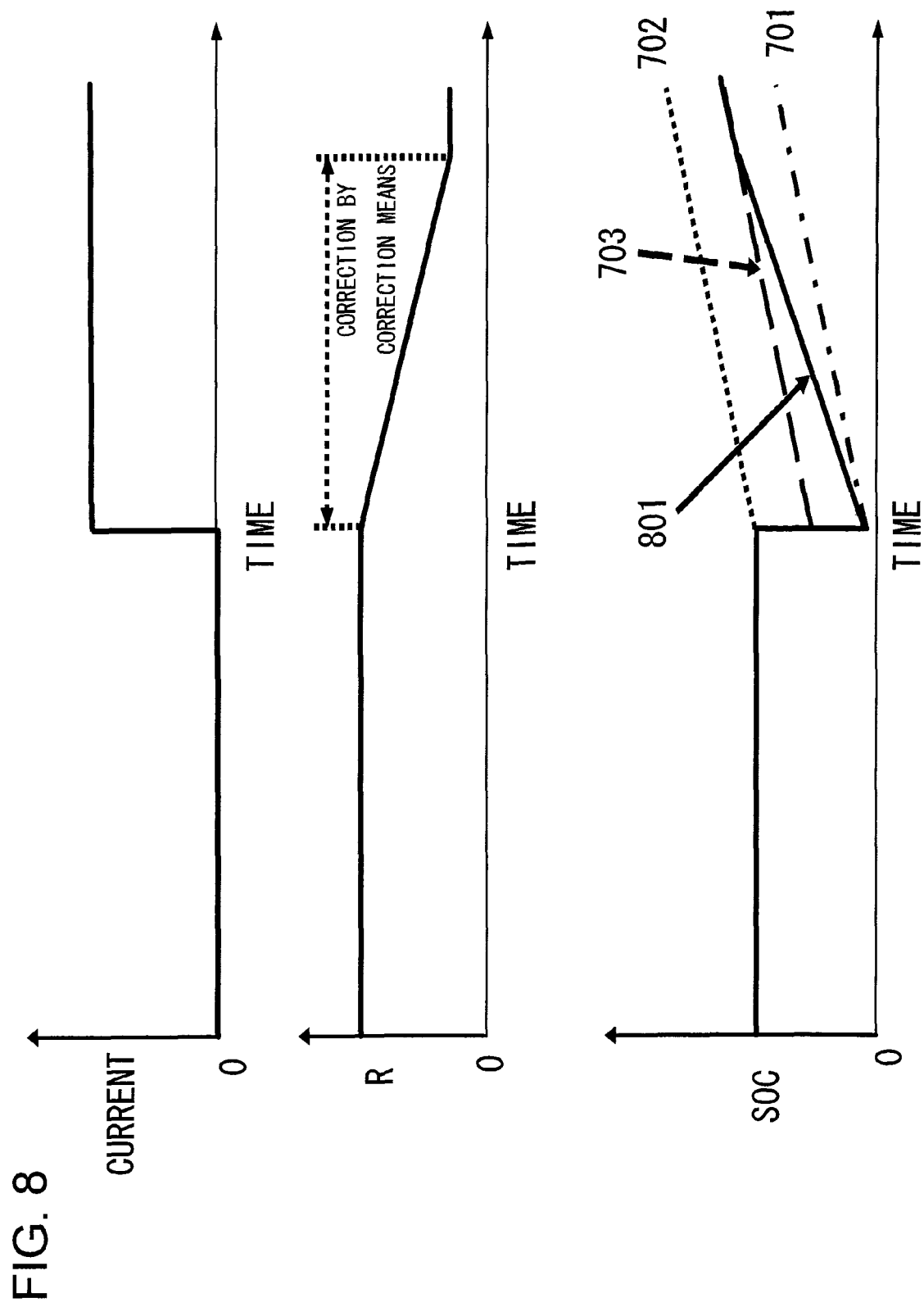
FIG. 8 is a graph showing the processing contents of the conflict detection means and the correction means related to the first embodiment of the present invention.

The operations of the conflict detection means 105 and the correction means 106 described above will now be explained in reference to FIG. 8. It is to be noted that the numerals 701, 702, and 703 in FIG. 8 are the same as those in FIG. 7. The numeral 801 indicates the state in which the conflict detection means 105 detects the SOCv error that occurs when R is too great, the correction means 106 applies the correction so as to reduce the internal DC resistance R, and consequently the SOCv error is resolved. Thus, the correction means 106 repeats the correction on R until the SOCv error becomes within the reference value. As is the case with the correction to raise the value of the internal DC resistance R described above, also in the case of the correction to reduce the value of the internal DC resistance R in the property information, the correction can be performed all the while the conflict detection means 105 is detecting the occurrence of the SOCv error. Alternatively, after a predetermined length of time has passed since charge or discharge of the power storage means 101 was initiated, the correction on the property information may be prohibited. In other words, time restriction may be placed, for example, the property information may be corrected for limited length of time such as one second, five seconds, ten seconds, and twenty seconds.

TABLE 1 presents the relationships between the operations of the conflict detection means 105 to detect a conflict deviating from the theoretical value explained above, the causes of the occurrence of the conflict, and the operations of the correction means 106 to resolve the conflict. Since the conflict detection means 105 thus detects the SOCv error, which occurs when R is too small, and the SOCv error, which occurs when R is too great, as a conflict deviating from the theoretical value, and the correction means 106 corrects R according to the conflict content, the state detection device that has little SOCv error and allows errors to be further reduced in the subsequent calculation for the SOCc can be achieved. In addition, since conflict detection by the conflict detection means 105 and correction processing on the property information by the correction means 106 can be performed even while charge or discharge is ongoing, even in the event that there is significant difference between the property information stored in the storage means 103 and the true value at the power storage means 101, it is possible to cause the property information in the storage means 103 to converge with the true value in the power storage means 101 in a relatively short amount of time.

TABLE 1

Operations of the Conflict Detection Means and the Correction Means Related to the Internal DC Resistance

| Operations of the Conflict Detection Means | Causes | Operations of the Correction Means |
| --- | --- | --- |
| Detect the SOCv Having Changed Significantly | R is Too Small | Correction to Raise R |
| Detect the SOCv Having Changed in the Opposite Direction | R is Too Great | Correction to Reduce R |

The operations of the conflict detection means 105 and the correction means 106 achieved in the present embodiment described above will now be explained in reference to FIG. 9 with regard to the difference in charge and discharge patterns (here, the example in which R is too small is presented). In FIG. 9, the numeral 901 represents the change in the SOCv, errors of which are improved by the correction on R, the numeral 902 represents the SOCc, and the numeral 903 represents the reference value used to detect the SOCv error. Under the conditions both in which charge and discharge are frequently switched (FIG. 9A) and in which charge and discharge are less frequently switched (FIG. 9B), it is considered that the lengths of time until the SOCv error is improved, i.e., the internal DC resistance R converges with an optimal value, are substantially equal if no restrictions such as time restriction are placed on the operations of the correction means 106 because there is no difference in the period of time in which the SOCv deviates from the reference value used to detect the SOCv error. In general, the number of detection timing of the internal DC resistance R is small in a pattern as FIG. 9B, in which charge and discharge are not frequently switched or the number of significant switches between charge and discharge current is small. In the event that processing in which the result of storing and averaging a plurality of detected internal DC resistances R is designated as the final value of the internal DC resistance detection is applied, since it takes a long time to store the necessary number of Rs to be averaged in FIG. 9B, resulting in a significant difference with FIG. 9A in the length of time to obtain the R optimal value (the SOCv error is improved). In the present invention, the internal DC resistances R can converge relatively quickly even in the condition with less frequent current change, and therefore the present invention is suitable for a variety of operations using the current internal DC resistance R of the power storage means 101 described above.

As described above, in the event that a current sensor of the measurement means 102 is extremely highly accurate and the SOCi, which has been calculated using equation 3 based upon the current sensor, does not substantially include the SOC error over the long term, all the processing using the SOCc in the conflict detection means 105 can be performed using the SOCi instead. In addition, the state detection device can use the SOCi in place of the SOCc to perform operations in a time short enough to ignore a cumulative error that occurs in the integral calculation of the SOCi. For instance, in the event of applying the processing of the conflict detection means 105 and the correction means 106 to high current discharge of the power storage means 101 associated with engine start-up at vehicle start-up, since the high current discharge associated with engine start-up finishes in a short amount of time, the SOCi can be applied in place of the SOCc as the cumulative error in the current integration is substantially negligible. Thus, in the event that the SOCi is used in place of the SOCc and the SOCv has the SOC value that deviates from the one which has been obtained by adding the threshold Th to the SOCi or by subtracting the threshold Th from the SOCi, the conflict detection means 105 detects the conflict and the correction means 106 corrects the property information.

As described above, by comparing the SOCv based upon the OCV with the SOCi based upon the current integration, the property information used by the SOCv can be optimized so as to fit the true property information of the power storage means 101 since the conflict detection and the correction processing on the property information by the conflict detection means 105 and the correction means 106 described above can be performed even while charge or discharge is ongoing, it is possible to achieve the state detection device for power supply system that can cause the property information stored in the storage means 103 to converge relatively quickly.

It is to be noted that in the embodiment explained above, the detection thresholds Th may all be a common value or each may be a different value instead. More specifically, in the event that the internal DC resistance (R) of the property information is smaller than the true properties of the power storage means 101, the threshold Th used for the decision upon charge as explained in FIG. 5 and the threshold Th used for the decision upon discharge can be set individually. In the event that the internal DC resistance (R) of the property information is greater than the true properties of the power storage means 101, the threshold Th used for the decision upon charge as explained in FIG. 7 and the threshold Th used for the decision upon discharge can be set individually as well. Each of these four types of the thresholds Th may be a different value. In addition, the detection thresholds Th may be determined according to the state of the power storage means 101 such as the SOC, the temperature, or the like.

-The Second Embodiment-

Figure 10:
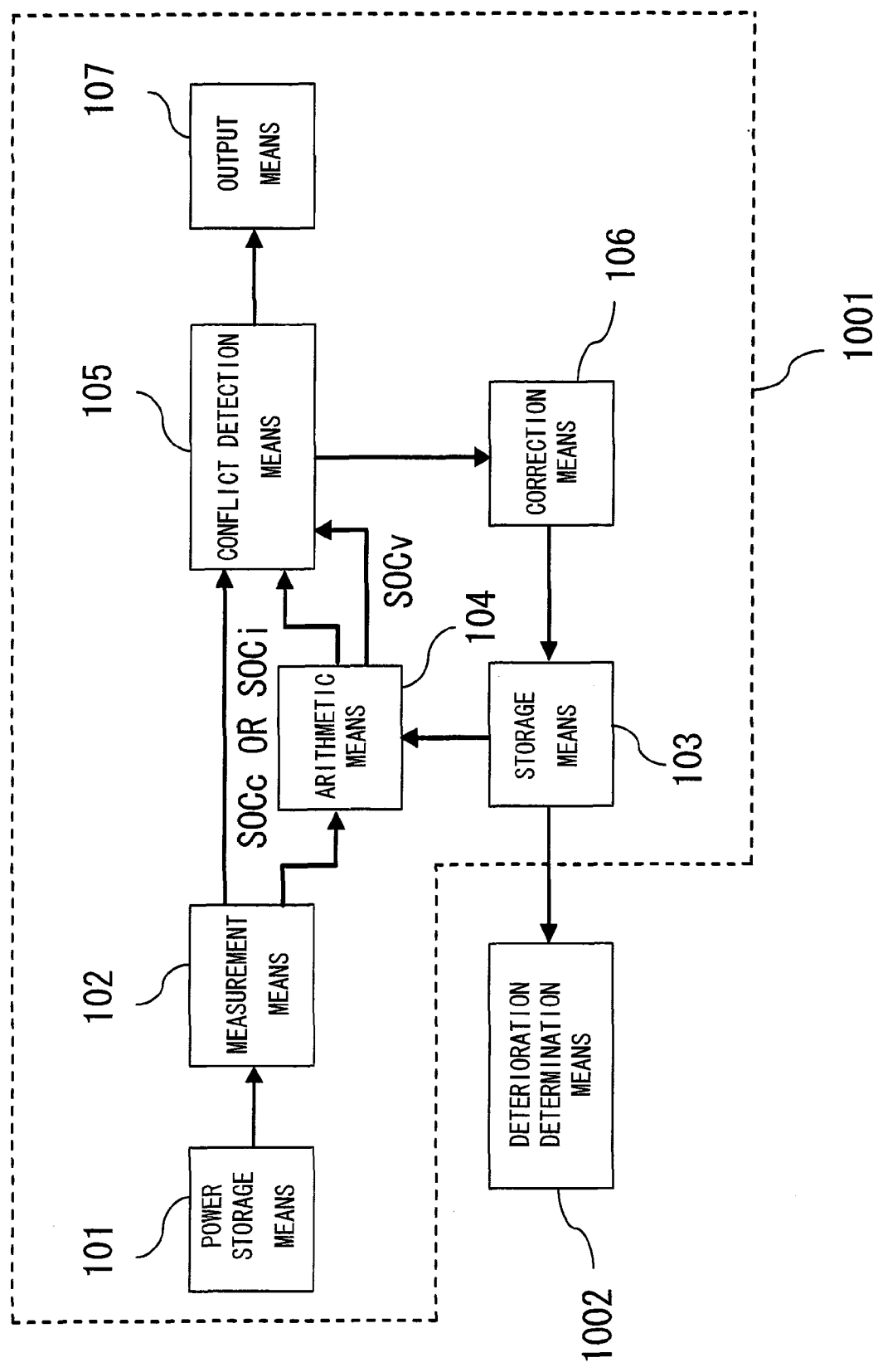
FIG. 10 is a block diagram of the state detection device for power supply system according to the second embodiment of the present invention.

FIG. 10 is a block diagram of the state detection device for power supply system according to the second embodiment of the present invention. The section denoted by the numeral 1001 has the same structure as the state detection device for power supply system according to the first embodiment shown in FIG. 1 has. The state detection device for power supply system according to the present embodiment further includes, in addition to the state detection device 1001, a deterioration determination means 1002 that monitors the storage means 103 regularly monitors.

The operation when the power storage means 101 is deteriorated will now be explained. When the power storage means 101 is deteriorated, in general, the internal DC resistance of the power storage means 101 rises. The IR drop that occurs when the current I is applied in the power storage means 101 whose internal DC resistance has risen is greater than that in the initial power storage means 101.

Figure 11:
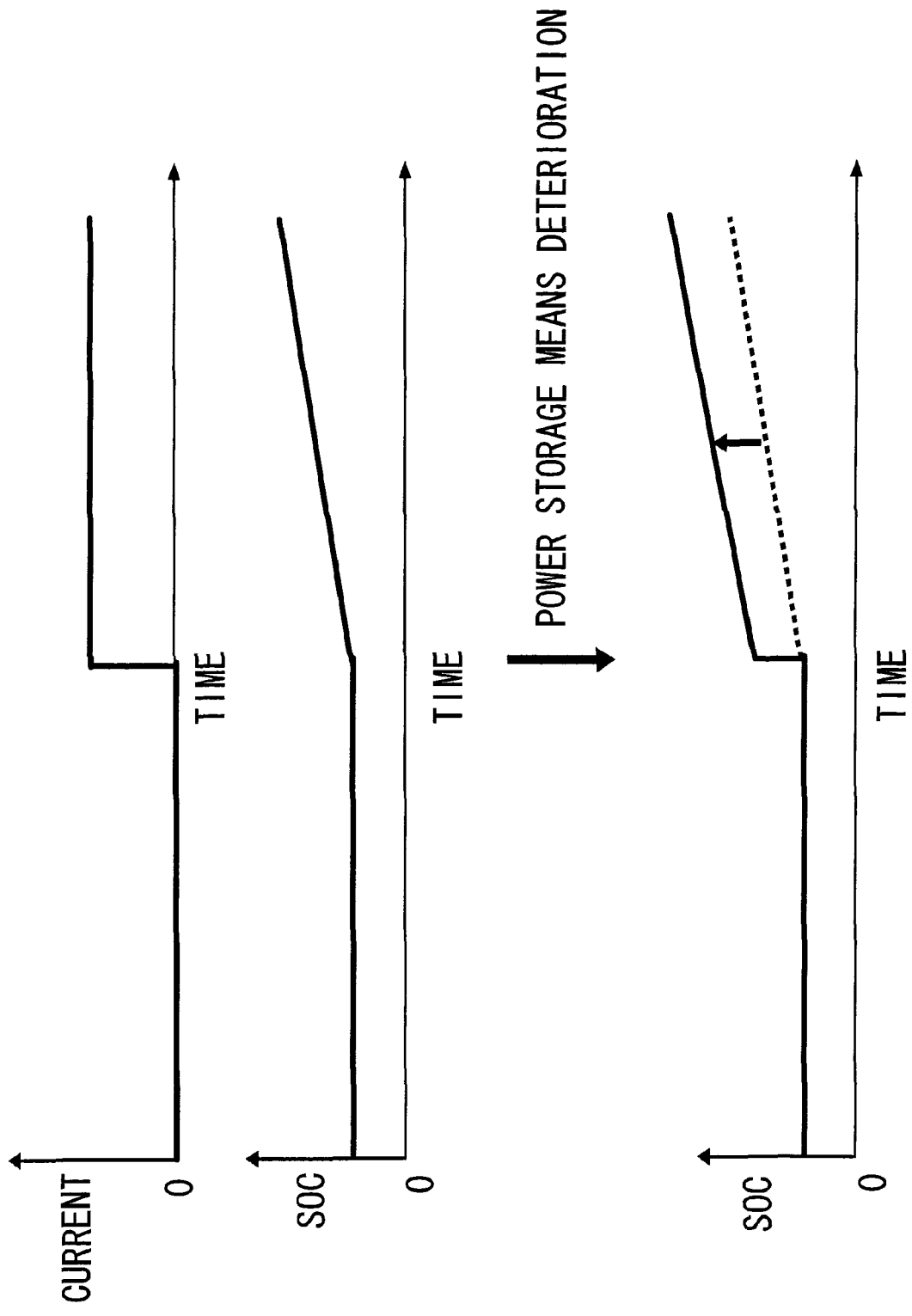
FIG. 11 is a graph showing the conflict detected in the case of deterioration of the power storage means related to the second embodiment of the present invention.

When the SOC estimation is performed on the deteriorated power storage means 101 using the property information having been set for the initial power storage means 101, as explained in the first embodiment described above, the result obtained includes a conflict deviating from the theoretical value. In other words, as shown in FIG. 11, when the power storage means 101 is deteriorated, the SOCv changes abruptly, and during charging, it exhibits a SOC value greater than the true value. During discharging, on the other hand, the SOCv exhibits a SOC value smaller than the true value (not figured).

The conflict detection means 105 detects the SOC error occurred by the processing described above as a conflict deviating from the theoretical value. When it is detected as a conflict, the correction means 106 is activated so as to apply a correction on the property information by the processing described above. In this case, the correction is applied so as to raise the value of the internal DC resistance R stored in the storage means 103 as property information, and then the correction result is stored in the storage means 103 as new property information.

When the power storage means 101 is deteriorated, the state detection device 1001 performs the operation as described above. In addition, when the power storage means 101 is deteriorated, the SOCv error is detected once again and the value of the internal DC resistance R is corrected. As the power storage means 101 is deteriorated, the state detection device 1001 repeats the above procedure.

Figure 12:
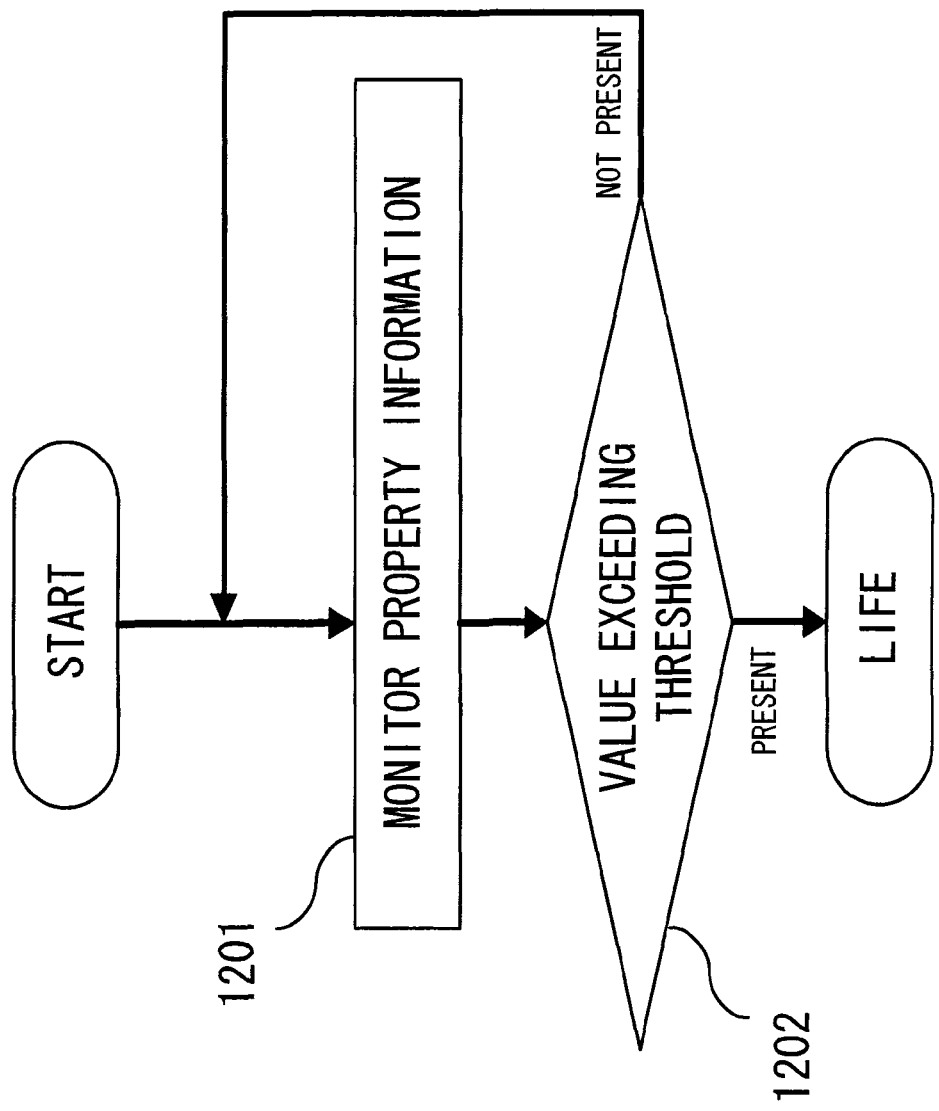
FIG. 12 presents an example of the operational flow of the deterioration determination means related to the second embodiment of the present invention.

The deterioration determination means 1002 includes a function to monitor the correction result of the property information by the correction means 106, i.e., the value of the corrected internal DC resistance R, and based upon the monitor result, to make a decision as to whether or not the life of the power storage means 101 has ended. FIG. 12 presents the operational flow of the deterioration determination means 1002. In a step 1201, the deterioration determination means 1002 monitors the corrected property information, i.e., the value of the corrected internal DC resistance R in the present embodiment. It is to be noted that in the property information, a variety of values are set for the internal DC resistance R according to the state of charge, the temperature, or the like of the power storage means 101. In a step 1202, the deterioration determination means 1002 checks whether or not the corrected internal DC resistance R monitored in the step 1201 includes one that exceeds a predetermined threshold. In the event that there is an internal DC resistance R that exceeds the predetermined threshold, the deterioration determination means 1002 makes a decision that the life of the power storage means 101 has ended. The threshold may be arbitrarily determined, for instance, as a value twice, three times, or the like of the initial value of the internal DC resistance R.

Figure 13:
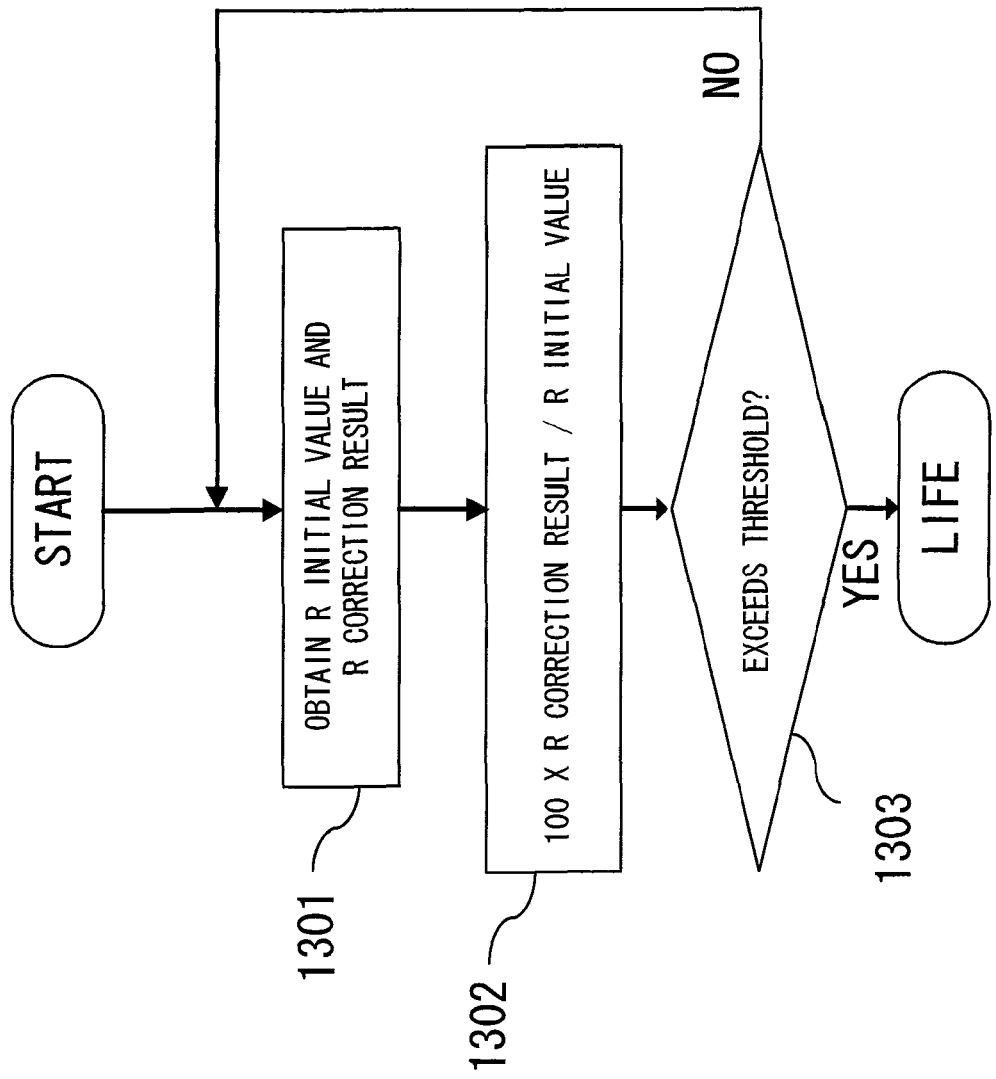
FIG. 13 presents another example of the operational flow of the deterioration determination means related to the second embodiment of the present invention.

FIG. 13 presents another example of the operational flow of the deterioration determination means 1002. In this case, it is assumed that the storage means 103 has already stored the initial property information, which has not been corrected yet, in a storage area and the current property information, which has been corrected, in another storage area. A correction on the property information that is applied by the correction means 106 is achieved by updating the last correction result stored not in the storage area in which the initial property information of the storage means 103 is stored but in another storage area in the storage means 103. In a step 1301, the deterioration determination means 1002 acquires the value of the internal DC resistance R based upon the initial property information and the value of the internal DC resistance R based upon the current property information, which has been corrected, from the storage means 103.

In a step 1302, the deterioration determination means 1002 uses the following equation 5 to calculate a rate of rise of the property information, which is in this case a rate of rise of the internal DC resistance R of the power storage means 101. In the even that the internal DC resistances R are stored in a table in the storage means 103 according to the temperature, the state of charge, or the like, the rates of rise of the internal DC resistance R to be calculated may be compared throughout the whole table and may assume an average value of the rates of rise, or may be compared in a limited range according to the current temperature or the state of charge. On the other hand, in the event that a common R value is stored in the storage means 103 regardless of the temperature or the state of charge, the rate of rise of the R is calculated using equation 5. It is to be noted that in equation 5, the value made by dividing the correction result of R by the initial value of R is multiplied by 100 so as to make the initial value of the rate of rise of the internal DC resistance 100 and so as to make it rise from 100 as the power storage means 101 is deteriorated. However, it is acceptable that, without multiplying 100, the initial value of the rate of rise of the internal DC resistance is 1 and becomes a value greater than 1 according to deterioration of the power storage means 101.

$$\text{Rate of Rise of } R = 100 \times \text{the correction result of } R/\text{the initial value of } R \qquad \text{(Equation 5)}$$

In a step 1303, the deterioration determination means 1002 makes a decision as to whether or not the rate of rise of the internal DC resistance R calculated in the step 1302 exceeds a predetermined threshold. In the event that the rate of rise of the internal DC resistance R exceeds the predetermined threshold, the deterioration determination means 1002 makes a decision that the life of the power storage means 101 has ended.

Alternatively, it is acceptable that in the step 1303, based upon the rate of rise of the internal DC resistance R calculated in the step 1302, the deterioration determination means 1002 calculates current or electric power that the power storage means 101 can input or output and, in the event that the calculated current or electric power falls below a predetermined threshold, makes a decision that the life of the power storage means 101 has ended. The threshold in this case can be determined according to, for instance, a required performance value for a system in which the power storage means 101 is used as an electric power source.

The deterioration determination means 1002 can be achieved as a microprocessor or a computer that performs processing described above. As shown in FIG. 10, the deterioration determination means 1002 may access directly to the storage means 103 so as to monitor the correction result of the property information, or may monitor the property information that has been read out by the arithmetic means 104. A display device provided in the deterioration determination means 1002 allows a progress status of the deterioration and a result of the decision as to the end of the life to be presented on a display or the like.

Although the deterioration determination means 1002 in FIG. 10 is provided outside the state detection device 1001, it may be achieved as a program module or a subroutine that performs the processing contents described above. In this case, the deterioration determination means 1002 can be implemented as an arithmetic procedure that is stored in the storage means 103 and executed by the arithmetic means 104. When the deterioration determination means 1002 is executed by the arithmetic means 104, the deterioration determination means 1002 directly monitors the storage means 103 or reads out the property information stored in the storage means 103 so as to monitor the property information through the processing described above. The deterioration progress status and the life decision result of the power storage means 101 judged by the deterioration determination means 1002 are transmitted from the arithmetic means 104 to the output means 107 together with the result of the state detection of the power storage means 101. In that case, the deterioration progress status and the life decision result of the power storage means 101 to be output by the output means 107 may be displayed by another microprocessor, computer, or the like connected to the output means 107, or may instead be used for a variety of controls.

Thus, according to the present embodiment, it can be achieved the state detection device for power supply system in which the property information is corrected corresponding to deterioration of the power storage means 101 and the correction result is monitored so as to make a quantitative decision as to the life of the power storage means 101.

-The Third Embodiment-

The state detection device for power supply system according to the third embodiment of the present invention will now be explained. The state detection device according to the present embodiment includes modifications on the operations of the measurement means 102 and the conflict detection means 105 of the state detection device according to the first embodiment shown in FIG. 1 or the state detection device according to the second embodiment shown in FIG. 10.

In the present embodiment, the measurement means 102 further includes a function to measure an ambient temperature in an environment in which the state detection device is installed and to output the measured value to the conflict detection means 105, in addition to the functions described above.

In the present embodiment, the conflict detection means 105 further performs the operations explained below, in addition to the operations described above. The operations performed by the conflict detection means 105 will be explained in reference to FIG. 14. In general, the measurement means 102 performs most accurately at a certain temperature (T0), and measurement errors increase as the temperature deviates from T0 (errors become large at T1 and T2). Hence, the conflict detection means 105 receives the ambient temperature measured by the measurement means 102 and makes a decision as to whether or not the ambient temperature is within a predetermined range. The range of the ambient temperature used for the decision can be determined, for example, as a range of temperature in which an error occurring when the operation described above is performed, which is calculated in advance in reference to the data of FIG. 14, falls on an acceptable range thereof. Thus, in the event that a decision is made that the ambient temperature falls outside the predetermined range, the conflict detection means 105 makes a decision that the environment does not meet the conflict detection explained in the first embodiment, thereby prohibiting the conflict detection so as to stop doing it.

Figure 14:
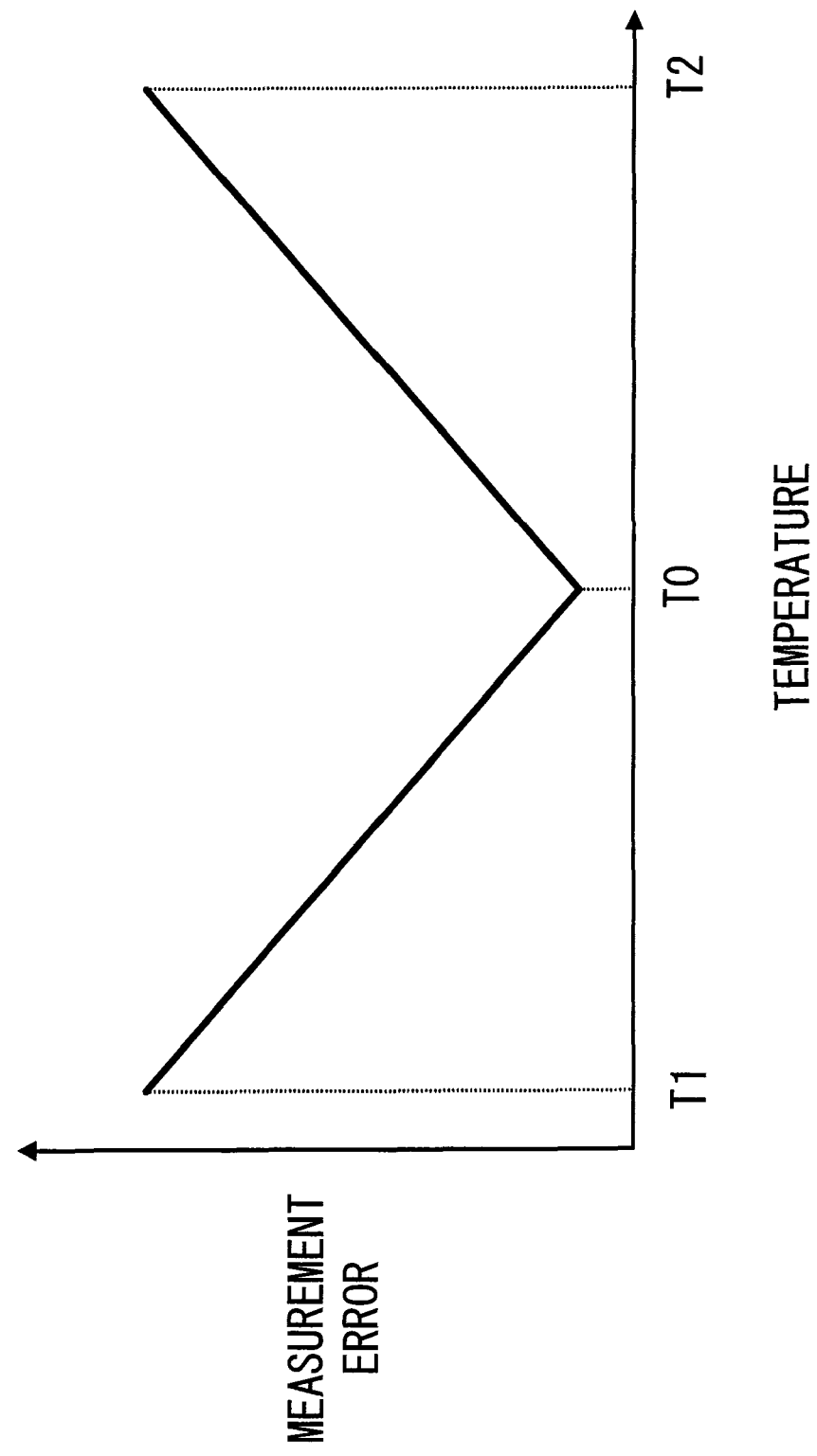
FIG. 14 is a graph showing the thermal properties of the measurement means related to the third embodiment of the present invention.

Alternatively, it is acceptable that the storage means 103 stores the properties of the measurement means 102 of FIG. 14 in advance, the arithmetic means 104 performs an error calculation in real time, and based upon the calculation result, a decision is made as to whether or not the conflict detection means 105 is activated. In this case, a signal used to make a decision as to whether or not to activate the conflict detection means 105 is transmitted from the arithmetic means 104 to the conflict detection means 105, and in response to the signal, the conflict detection means 105 is activated.

According to the present embodiment, it can be achieved the state detection device for power supply system that can highly accurately detect the state of the power storage means 101 by considering the error properties according to the temperature of the measurement means 102.

-The Fourth Embodiment-

Figure 15:
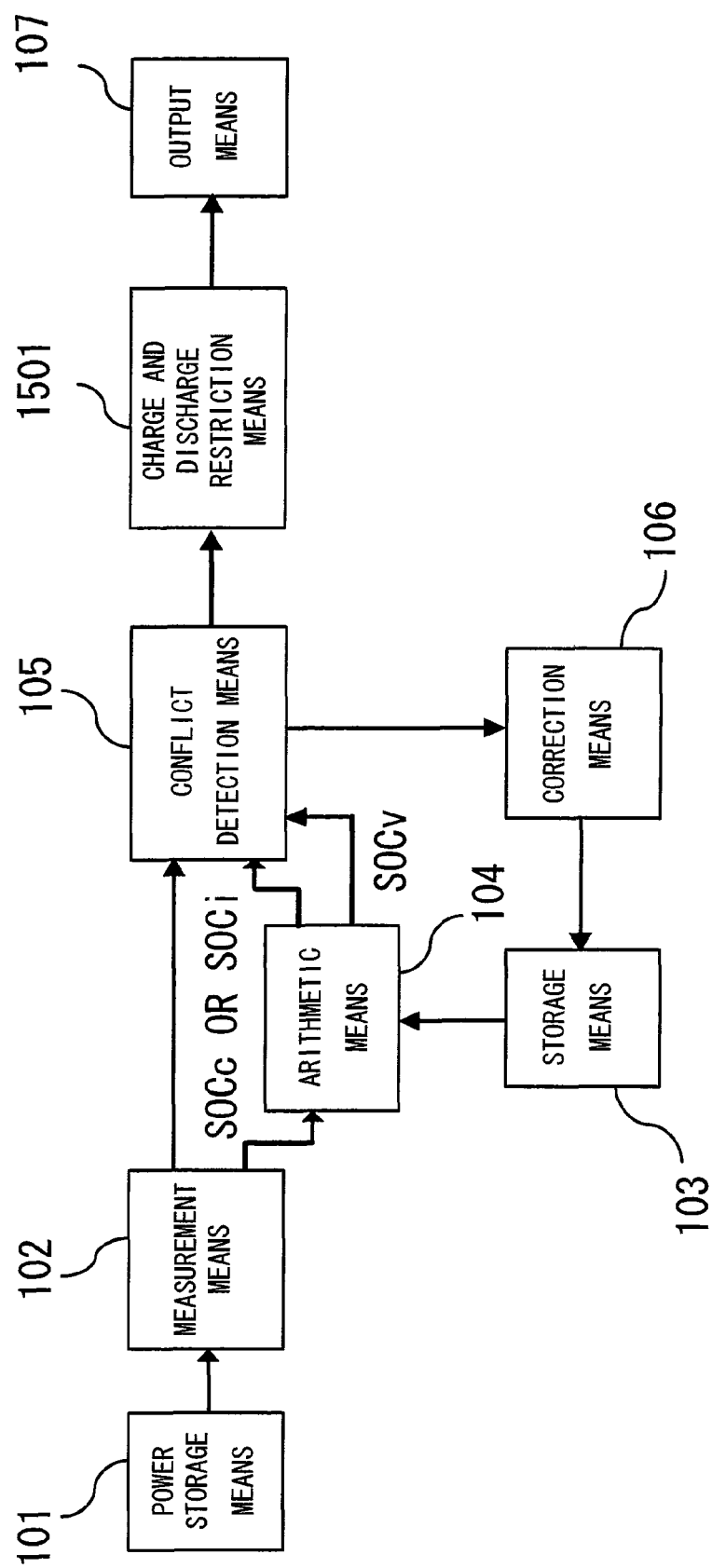
FIG. 15 is a block diagram of an example of the state detection device for power supply system according to the fourth embodiment of the present invention.
Figure 16:
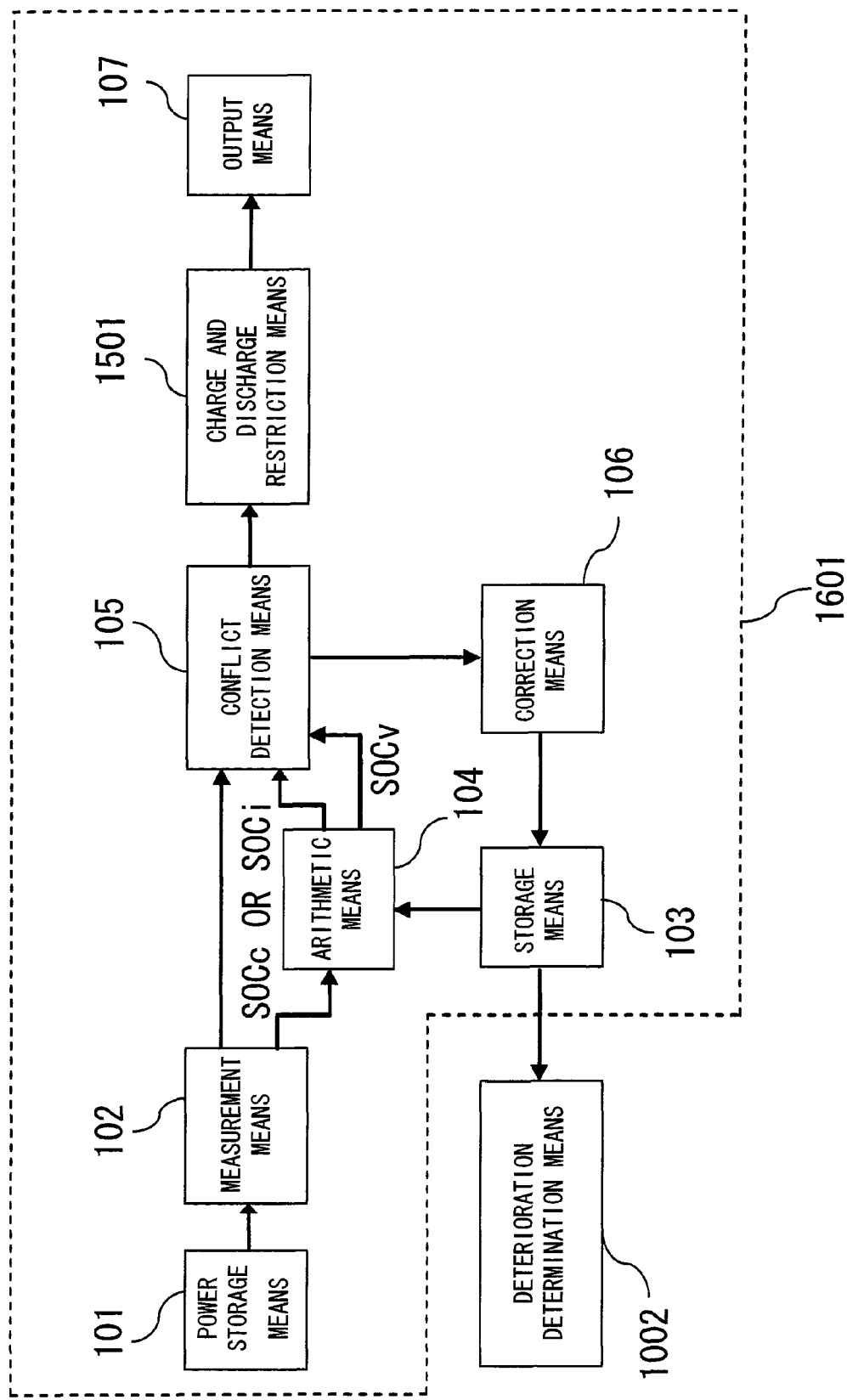
FIG. 16 is a block diagram of another example of the state detection device for power supply system according to the fourth embodiment of the present invention.

FIGS. 15 and 16 are block diagrams of the state detection device for power supply system according to the fourth embodiment of the present invention. The state detection device shown in FIG. 15 includes modifications on the processing content of the arithmetic means 104 of the state detection device according to the first embodiment shown in FIG. 1 and further includes a charge and discharge restriction means 1501. The state detection device shown in FIG. 16 includes modifications on the processing content of the arithmetic means 104 of the state detection device according to the second embodiment shown in FIG. 10 and further includes the charge and discharge restriction means 1501. It is to be noted that the section denoted by the numeral 1601 in FIG. 16 is the same as the block diagram shown in FIG. 15. The processing contents of the arithmetic means 104 of both cases are the same and the operations of the charge and discharge restriction means 1501 of both cases are the same.

In the present embodiment, the arithmetic means 104 further calculates a current value or an electric power value that the power storage means 101 can input or output, in addition to the processing described above. In general, when the state of charge of the power storage means 101 is high, a current value and an electric power value that the power storage means 101 can output are high and a current value and an electric power value that the power storage means 101 can input are low. On the other hand, when the state of charge of the power storage means 101 is low, a current value and an electric power value that the power storage means 101 can output are low and a current value and an electric power value that the power storage means 101 can input are high. The current value or the electric power value that the power storage means 101 can input or output calculated by the arithmetic means 104 is output to a controller externally provided through the output means 107. The external controller controls so that the power storage means 101 is charged or discharged within the range of the received current value or electric power value. Now, the current value that the power storage means 101 can input is represented by an allowable charge current Icmax, and the electric power value that the power storage means 101 can input is represented by an allowable charge electric power Pcmax. The current value that the power storage means 101 can output is represented by an allowable discharge current Idmax, and the electric power value that the power storage means 101 can output is represented by an allowable discharge electric power Pdmax.

Figure 17:
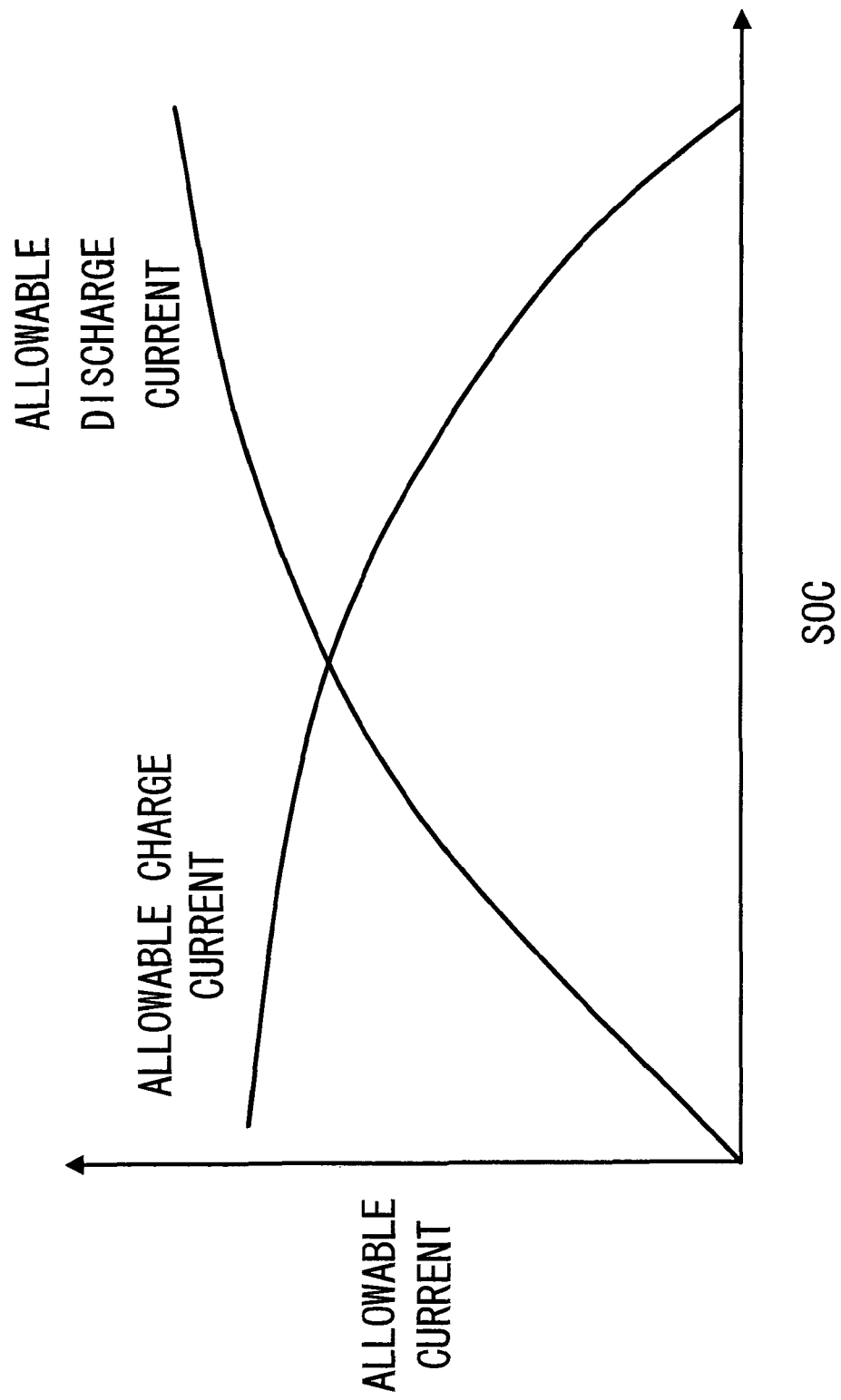
FIG. 17 is a graph illustrating the relationship between the SOC of the power storage means related to the fourth embodiment of the present invention and allowable charge and discharge current.

The allowable charge current Icmax and the allowable discharge current Idmax are calculated using the following equations.

$$Ic\text{max}=(V\text{max}-OCV)/RZ \quad \text{(Equation 6)}$$

$$Id\text{max}=(OCV-V\text{min})/RZ \quad \text{(Equation 7)}$$

where Vmax represents the maximum voltage at the power storage means 101, Vmin represents the minimum voltage at the power storage means 101, OCV represents the present electromotive force of the power storage means 101, and RZ represents the present equivalent impedance of R, Z, and C of FIG. 3 at the power storage means 101. It is to be noted that as shown in FIG. 16, it is preferable that the state detection device that includes the deterioration determination means 1002 updates RZ in response to the progress of deterioration of the power storage means 101 and calculates allowable charge and discharge current corresponding to the performance of the power storage means 101. FIG. 17 presents a scheme of the allowable current calculated using equations 6 and 7.

As the following equation 8 expresses, the allowable charge electric power Pcmax is obtained by multiplying the allowable charge current Icmax expressed by equation 6 by voltage Vchg at the power storage means 101 when the allowable charge current Icmax is obtained. As the following equation 9 expresses, the allowable discharge electric power Pdmax is obtained by multiplying the allowable discharge current Idmax expressed by equation 7 by voltage Vdis at the power storage means 101 when the allowable discharge current Idmax is obtained.

$$Pc\text{max}=V\text{chg}\times Ic\text{max} \quad \text{(Equation 8)}$$

$$Pd\text{max}=V\text{dis}\times Id\text{max} \quad \text{(Equation 9)}$$

As described above, based upon the SOCv calculated using equation 2 and the SOCc or the SOCi calculated using equation 4 or equation 3 by the arithmetic means 104, the conflict detection means 105 activates the correction means 106 in the event that a difference equal to or greater than the predetermined threshold Th has occurred in the both SOC. On the other hand, the charge and discharge restriction means 1501 restricts the allowable charge and discharge current or the allowable charge and discharge electric power described above in the event that it is detected that the difference between the SOCv and the SOCc or the SOCi obtained by the arithmetic means 104 is equal to or greater than the predetermined threshold Th'.

The processing content of the charge and discharge restriction means 1501 will be explained in detail in reference to FIG. 18. In FIG. 18, the numeral 1801 represents the SOCv, the numeral 1802 denotes the SOCc or the SOCi, the numeral 1803 denotes the SOCc_+Th' or the SOCi_+Th', which are calculated by adding the threshold Th' to the SOCc or the SOCi, respectively, denoted by the numeral 1802. In the event that the arithmetic means 104 uses equation 6 and equation 7 to calculate the allowable charge current Icmax and the allowable discharge current Idmax, respectively, the charge and discharge restriction means 1501 restricts the allowable charge current Icmax denoted by the numeral 1804 to the value denoted by the numeral 1806 and restricts the allowable discharge current Idmax denoted by the numeral 1805 to the value denoted by the numeral 1807 when the SOCv exceeds the SOCc_+Th' or the SOCi_+Th' during charging of the power storage means 101. Similarly, also in the event that the SOCv falls below the SOCc_–Th' or the SOCi_–Th' during discharging of the power storage means 101, the charge and discharge restriction means 1501 restricts the allowable charge current Icmax denoted by the numeral 1804 to the value denoted by the numeral 1806 and restricts the allowable discharge current Idmax denoted by the numeral 1805 to the value denoted by the numeral 1807.

On the other hand, the charge and discharge restriction means 1501 restricts the allowable charge and discharge electric power in the event that the arithmetic means 104 uses equation 8 and equation 9 to calculate the allowable charge electric power Pcmax and the allowable discharge electric power Pdmax, respectively. More specifically, in the event that the SOCv exceeds the SOCc_+Th' or the SOCi_+Th' during charging of the power storage means 101 and in the event that the SOCv falls below the SOCc_–Th' or the SOCi_–Th' during discharging of the power storage means 101, the charge and discharge restriction means 1501 restricts each of the allowable charge electric power Pcmax and the allowable discharge electric power Pdmax to a predetermined value.

It is preferable that the threshold Th', which is used for the above decision, is set to the value equal to or greater than the threshold Th, which is used by the conflict detection means 105 for the conflict detection described above. The occurrence of an error equal to or greater than a predetermined value in the SOCv represents the occurrence of a significant difference between the property information of the power storage means 101 stored in the storage means 103 and the true property information of the power storage means 101. It is acceptable that the error in the allowable charge and discharge current or the allowable charge and discharge electric power arising from the difference in the property information is calculated, the SOCv error arising from the difference in the property information exceeding the allowable error is calculated, and the SOCv error is designated to the threshold Th'. It is to be noted that the restriction on the allowable charge and discharge current or the allowable charge and discharge electric power may be simply ½ or ⅓ of the original value, or alternatively, may be an allowable charge and discharge current or an allowable charge and discharge electric power in a state in which the power storage means 101 is most deteriorate and can not input or output current or electric power. In addition, the value used for the restriction can be set according to the amount of errors having occurred in the SOCv.

Thus, according to the present embodiment, the charge and discharge restriction means 1501 is provided to compare the SOCv with the SOCc or the SOCi so as to detect a significant difference having occurred between the property information of the power storage means 101 and the property information of the storage means 103, thereby achieving precise restrictions on allowable charge and discharge current or allowable charge and discharge electric power. As a result, the state detection device for power supply system that can perform the operation to reliably control the charge and discharge of the power storage means 101 can be achieved.

The state detection device for power supply system according to the present invention can estimate the state of charge of the power storage means with a high degree of accuracy, can make a quantitative decision as to the progress of deterioration of the power storage means or the life thereof, and can perform the operation to reliably control the charge and discharge of the power storage means. The state detection device for power supply system can be applied to a wide range of fields such as mobiles, uninterruptible power supplies (UPS), and vehicles including hybrid electric vehicles (HEV) or electric vehicles (EV).

It is to be noted that each of the embodiments and one or a plurality of the modifications explained above may be combined. The modifications may be combined in any manner.

The above explanation is an example and the present invention is not limited to the structures presented in the above described embodiments.

What is claimed is:

1. A state detection device for power supply system comprising:
    a measurement unit that obtains current, voltage, and temperature at a chargeable and dischargeable power storage unit as measurement values;
    a storage unit that stores property information of the power storage unit;
    an arithmetic unit that uses different methods to calculate a first state of charge and a second state of charge, each of which indicates a state of charge of the power storage unit, based upon the measurement values and the property information stored in the storage unit;
    a conflict detection unit that monitors a calculation result of a state of charge by the arithmetic unit during charging or discharging of the power storage unit, and detects the calculation result as a conflict in an event that a difference between the first state of charge and the second state of charge is equal to or greater than a predetermined threshold; and
    a correction unit that corrects the property information stored in the storage unit in response to the conflict having been detected by the conflict detection unit.

2. A state detection device for power supply system according to claim 1, wherein:
    the arithmetic unit calculates the first state of charge based upon open circuit voltage at the power storage unit, and calculates the second state of charge based upon integrated current at the power storage unit or based upon a weighted average of the first state of charge and integrated current.

3. A state detection device for power supply system according to claim 2, wherein:
    the threshold includes a first threshold, a second threshold, a third threshold, and a fourth threshold; and
    the conflict detection unit detects a first conflict as the conflict in an event that the first state of charge is greater than the second state of charge and the difference between the first state of charge and the second state of charge is equal to or greater than the first threshold during charging of the power storage unit or in an event that the first state of charge is smaller than the second state of charge and the difference between the first state of charge and the second state of charge is equal to or greater than the second threshold during discharging of the power storage unit, and detects a second conflict as the conflict in an event that the first state of charge is smaller than the second state of charge and the difference between the first state of charge and the second state of charge is equal to or greater than the third threshold during charging of the power storage unit or in an event that the first state of charge is greater than the second state of charge and the difference between the first state of charge and the second state of charge is equal to or greater than the fourth threshold during discharging of the power storage unit.

4. A state detection device for power supply system according to claim 3, wherein:
    the correction unit corrects the property information so as to raise it in an event that the conflict detection unit has detected the first conflict, and corrects the property information so as to reduce it in an event that the conflict detection unit has detected the second conflict.

5. A state detection device for power supply system according to claim 1, wherein:
    the threshold is determined based upon at least any one of an offset error, a gain error, a thermal properties error, a quantization error, and a hysteresis error included in the measurement values.

6. A state detection device for power supply system according to claim 1, wherein:
    the correction unit prohibits a correction on the property information after a predetermined time has elapsed since charge or discharge of the power storage unit was initiated.

7. A state detection device for power supply system according to claim 1, wherein:
    the property information is an internal DC resistance value of the power storage unit.

8. A state detection device for power supply system according to claim 7, further comprising:
    a deterioration determination unit that makes a decision as to whether or not a life of the power storage unit has ended based upon a correction result of the internal DC resistance value by the correction unit.

9. A state detection device for power supply system according to claim 8, wherein:
    the deterioration determination unit calculates a rate of rise of the internal DC resistance value based upon a correction result of the internal DC resistance value and an initial value of the internal DC resistance value, and makes a decision as to whether or not a life of the power storage unit has ended based upon the calculation result.

10. A state detection device for power supply system according to claim 9, wherein:
the deterioration determination unit makes a decision that a life of the power storage unit has ended in an event that the rate of rise becomes equal to or greater than a predetermined value.

11. A state detection device for power supply system according to claim 9, wherein:
the deterioration determination unit calculates current or electric power that the power storage unit can input or output based upon the rate of rise and, in an event that the current or electric power falls below a predetermined required performance value, makes a decision that a life of the power storage unit has ended.

12. A state detection device for power supply system according to claim 1, wherein:
the measurement unit further obtains an ambient temperature as the measurement value; and
the conflict detection unit prohibits a detection of the conflict in an event that the ambient temperature falls outside a predetermined range.

13. A state detection device for power supply system according to claim 1, wherein the arithmetic unit performs a state detection of the power storage unit and calculates a current value or an electric power value that the power storage unit can input or output, further comprising:
an output unit that outputs the current value or the electric power value that has been calculated by the arithmetic unit; and
a charge and discharge restriction unit that restricts the current value or the electric power value output by the output unit in an event that a result of the state detection by the arithmetic unit meets a predetermined condition during charging or discharging of the power storage unit.

14. A state detection device for power supply system comprising:
a measurement unit that obtains current, voltage, and temperature at a chargeable and dischargeable power storage unit as measurement values;
a storage unit that stores property information of the power storage unit;
an arithmetic unit that uses different methods to calculate a first state of charge and a second state of charge, each of which indicates a state of charge of the power storage unit, and calculates a current value or an electric power value that the power storage unit can input or output, based upon the measurement values and the property information stored in the storage unit;
an output unit that outputs the current value or the electric power value that has been calculated by the arithmetic unit; and
a charge and discharge restriction unit that restricts the current value or the electric power value output by the output unit in an event that a difference between the first state of charge and the second state of charge is equal to or greater than a predetermined threshold during charging or discharging of the power storage unit.

15. A state detection device for power supply system according to claim 8, wherein:
the deterioration determination unit calculates current or electric power that the power storage unit can input or output based upon the correction result of the internal DC resistance value and, in an event that the current or electric power falls below a predetermined required performance value, makes a decision that a life of the power storage unit has ended.

16. A power storage system comprising:
a chargeable and dischargeable power storage device: and
a state detection device that detects a state of the power storage device, wherein the state detection device comprises:
a measurement unit that obtains current, voltage, and temperature at the power storage device as measurement values;
a storage unit that stores property information of the power storage device;
an arithmetic unit that uses different methods to calculate a first state of charge and a second state of charge, each of which indicates a state of charge of the power storage device, based upon the measurement values and the property information stored in the storage unit;
a conflict detection unit that monitors a calculation result of a state of charge by the arithmetic unit during charging or discharging of the power storage device, and detects the calculation result as a conflict in an event that a difference between the first state of charge and the second state of charge is equal to or greater than a predetermined threshold; and
a correction unit that corrects the property information stored in the storage unit in response to the conflict having been detected by the conflict detection unit.

17. A power storage system comprising:
a chargeable and dischargeable power storage device: and
a state detection device that detects a state of the power storage device, wherein the state detection device comprises:
a measurement unit that obtains current, voltage, and temperature at the power storage device as measurement values;
a storage unit that stores property information of the power storage device;
an arithmetic unit that uses different methods to calculate a first state of charge and a second state of charge, each of which indicates a state of charge of the power storage device, and calculates a current value or an electric power value that the power storage device can input or output, based upon the measurement values and the property information stored in the storage unit:
an output unit that outputs the current value or the electric power value that has been calculated by the arithmetic unit; and
a charge and discharge restriction unit that restricts the current value or the electric power value output by the output unit in an event that a difference between the first state of charge and the second state of charge is equal to or greater than a predetermined threshold during charging or discharging of the power storage device.

* * * * *